United States Patent
Li et al.

(10) Patent No.: US 9,843,337 B1
(45) Date of Patent: Dec. 12, 2017

(54) BACKGROUND FLASH OFFSET CALIBRATION IN CONTINUOUS-TIME DELTA-SIGMA ADCS

(71) Applicant: Analog Devices Global, Hamilton (BM)

(72) Inventors: Zhao Li, North York (CA); Trevor Clifford Caldwell, Toronto (CA); David Nelson Alldred, Toronto (CA); Yunzhi Dong, Weehawken, NJ (US); Prawal Man Shrestha, Somerville, MA (US); Jialin Zhao, Santa Clara, CA (US); Hajime Shibata, Toronto (CA); Victor Kozlov, Toronto (CA); Richard E. Schreier, New Castle (CA); Wenhua W. Yang, Lexington, MA (US)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/460,433

(22) Filed: Mar. 16, 2017

(51) Int. Cl.
  H03M 1/12 (2006.01)
  H03M 1/10 (2006.01)
  H03M 3/00 (2006.01)

(52) U.S. Cl.
  CPC ....... H03M 1/1023 (2013.01); H03M 1/1009 (2013.01); H03M 1/12 (2013.01); H03M 3/464 (2013.01)

(58) Field of Classification Search
  CPC .... H03M 1/1023; H03M 1/1009; H03M 1/12; H03M 3/464
  USPC .................................................. 341/120, 155
  See application file for complete search history.

(56) References Cited

U.S. PATENT DOCUMENTS

| | | | | |
|---|---|---|---|---|
| 5,598,157 A | * | 1/1997 | Kornblum | H03M 3/38 341/120 |
| 6,346,898 B1 | | 2/2002 | Melanson | |
| 6,380,874 B1 | * | 4/2002 | Knudsen | H03M 3/388 341/118 |
| 6,449,569 B1 | * | 9/2002 | Melanson | H03M 3/378 341/118 |
| 7,064,693 B1 | | 6/2006 | Huang et al. | |

(Continued)

OTHER PUBLICATIONS

Chun-Cheng Huang et al., *A Background Comparator Calibration Technique for Flash Analog-to-Digital Converters*, IEEE Transactions on Circuits and Systems—I: Regular Papers, vol. 52, No. 9, Sep. 2005, 9 pages.

(Continued)

*Primary Examiner* — Brian Young
(74) *Attorney, Agent, or Firm* — Patent Capital Group

(57) ABSTRACT

Analog-to-digital converters (ADCs) can be used inside ADC architectures, such as delta-sigma ADCs. The error in such internal ADCs can degrade performance. To calibrate the errors in an internal ADC, comparator offsets of the internal ADC can be estimated by computing a mean of each comparator of the internal ADC. Relative differences in the computed means serves as estimates for comparator offsets. If signal paths in the internal ADC are shuffled, the estimation of comparator offsets can be performed in the background without interrupting normal operation. Shuffling of signal paths may introduce systematic measurement errors, which can be measured and reversed to improve the estimation of comparator offsets.

20 Claims, 20 Drawing Sheets

(56) References Cited

U.S. PATENT DOCUMENTS

| | | | |
|---|---|---|---|
| 8,284,091 B2 | 10/2012 | Van Der Ploeg et al. | |
| 8,330,632 B2 | 12/2012 | Bashirullah et al. | |
| 8,779,952 B1 | 7/2014 | Zortea | |
| 8,810,442 B1 | 8/2014 | Zortea | |
| 8,884,802 B2 * | 11/2014 | Li | H03M 1/1009 341/155 |
| 9,124,292 B2 | 9/2015 | Li et al. | |
| 2015/0372689 A1 | 12/2015 | Xi et al. | |

OTHER PUBLICATIONS

Boris Murmann, *Digitally Assisted Data Converter Design*, © 2013 IEEE, 978-1-4799-0645-1/13, 8 pages.

Hsuan-Yu Chang et al., *A Reference Voltage Interpolation-Based Calibration Method for Flash ADCs*, IEEE Transactions on Very Large Integration (VLSI) Systems, vol. 24, No. 5, May 2016, 11 pages.

\* cited by examiner

BACKGROUND FLASH OFFSET CALIBRATION IN CONTINUOUS-TIME DELTA-SIGMA ADCS

TECHNICAL FIELD OF THE DISCLOSURE

The present disclosure relates generally to analog-to-digital converters (ADCs) and, more particularly, to background flash offset calibration in continuous-time delta-sigma ADCs (CT DS ADCs).

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Analog-to-digital converters (ADCs) can be used inside ADC architectures, such as delta-sigma ADCs. The error in such internal ADCs can degrade performance. To calibrate the errors in an internal ADC, comparator offsets of the internal ADC can be estimated by computing a mean of each comparator of the internal ADC. Relative differences in the computed means serves as estimates for comparator offsets. When signal paths in the internal ADC are shuffled, the estimation of comparator offsets can be performed in the background without interrupting normal operation. Shuffling of signal paths may introduce systematic measurement errors, which can be measured and reversed to improve the estimation of comparator offsets.

Designing analog-to-digital converters (ADCs)

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

Figure 1:
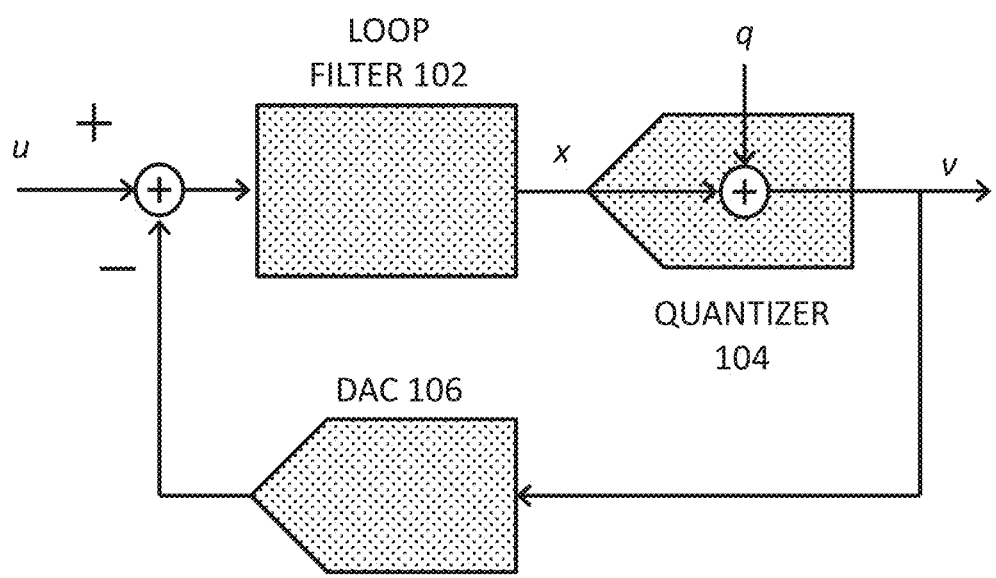
FIG. 1 is an illustrative system diagram of a delta-sigma analog-to-digital converter (DS ADC), according to some embodiments of the disclosure.

ADCs based on delta-sigma (DS) modulation (referred to herein as "DS ADCs") have been widely used in digital audio and high precision instrumentation systems. FIG. 1 is an illustrative system diagram of a delta-sigma analog-to-digital converter (DS ADC), according to some embodiments of the disclosure. Sometimes the DS ADC is referred herein as a delta-sigma modulator. The DS ADC includes loop filter 102, quantizer 104, and feedback digital-to-analog converter (DAC) 106 (i.e., a DAC in the feedback path of the DS ADC).

A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., Quantizer 104) to form a higher-resolution digital output. Loop filter 102, having one or more integrators, may be included to provide error feedback for the DS ADC and to help shape the noise from the quantizer 104 out of baseband to out-of-band frequencies. The loop filter 102 receives an analog input u, filters the analog input u, and outputs analog signal x. The quantizer 104 receives analog signal x and generates a multi-level output v based on the analog input x provided to the quantizer. The multi-level output v is fed back to the input via the feedback DAC 106. The error is usually generated by taking the difference between the original analog input signal u and a reconstructed version of the original analog input signal generated using the feedback DAC 106 (where digital output v is converted back into an analog signal). One key characteristic of a DS ADC is its ability to push the quantization noise q (from quantizer 104) to out-of-band frequencies, also referred to as noise shaping. The amount of noise shaping depends on the order of the loop filter 102. As a result, DS ADCs are generally able to achieve high resolution analog-to-digital conversion. Due to its popularity, many variations on the DS ADC and structures employing the DS ADC have been proposed.

Figure 2:
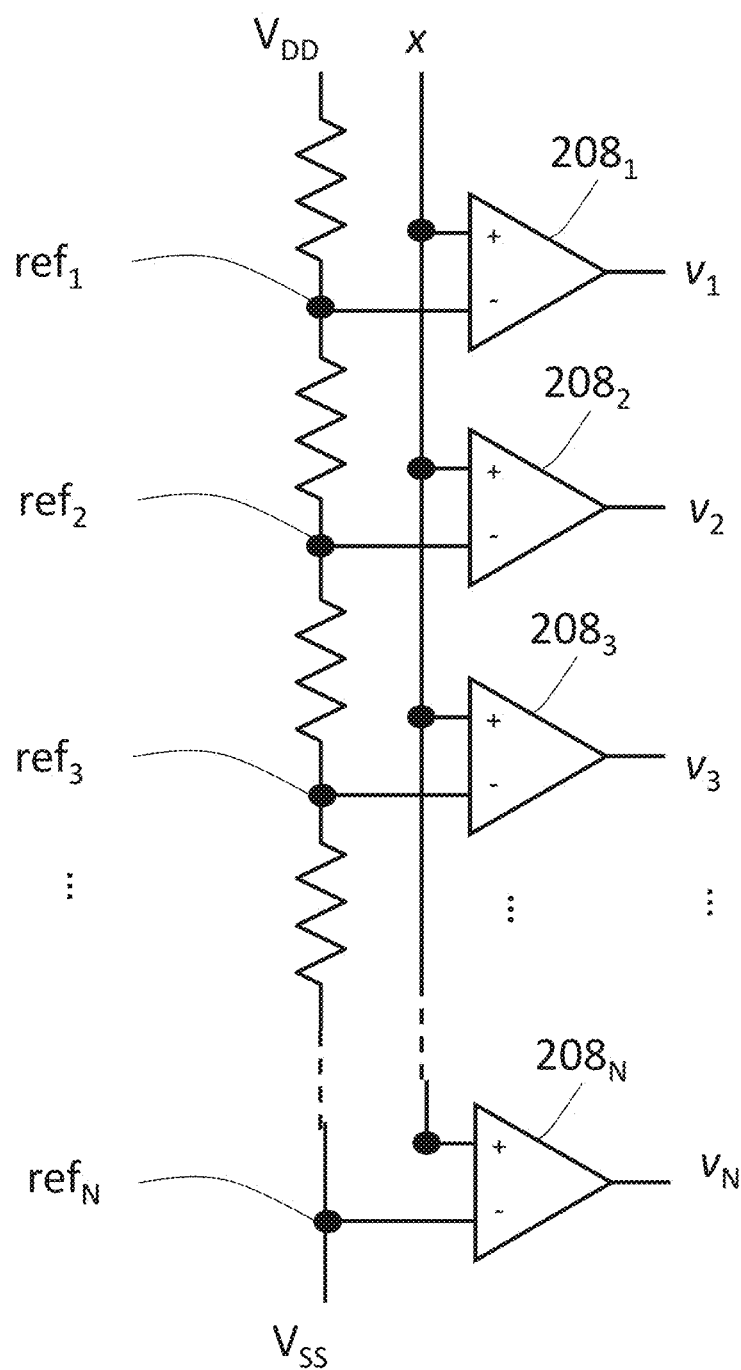
FIG. 2 is an exemplary quantizer, according to some embodiments of the disclosure.

FIG. 2 is an exemplary quantizer, according to some embodiments of the disclosure. The quantizer 104 can include a plurality of 1-bit ADCs. In FIG. 2, the 1-bit ADCs are represented as N comparators $208_1, 208_2, 208_3, \ldots 208_N$. The 1-bit ADCs compares the analog signal x against a plurality of respective reference voltages $ref_1$, $ref_2$, $ref_3$, ... $ref_N$ to generate a multi-level output v (which can be thermometer coded). Ideally, the references voltages $ref_1$, $ref_2$, $ref_3$, ... $ref_N$ provide equally spaced voltages across a voltage range. In this example, a resistor ladder generates the reference voltages $ref_2$, $ref_3$, ... $ref_N$. The 1-bit ADCs can together determine the multi-level output v which digitally represents the analog signal x. For instance, N comparators can generate respective N outputs $v_1, v_2, v_3, \ldots V_N$, thus providing an N+1 level output or data. Depending on the implementation, a 1-bit ADC can have different sets of possible outputs: (A) "1" or a "0", (B) "+1" or "4", (C) or "+LSB" or "−LSB" (LSB being an amount equivalent to the weight of a least significant bit of the digital output v). Different output levels of a particular 1-bit ADC indicate whether the analog signal x is greater than or less than the respective reference voltage at the input of the particular 1-bit ADC or comparator.

Herein, 1-bit ADC and comparator are used interchangeably. Also, quantizer and flash ADC are also used interchangeably.

Different variations on the DS ADC have been proposed to achieve various advantages suitable for a variety of systems. In some applications, DS ADCs have been adapted to meet power concerns, while some other DS ADCs have been adapted to reduce complexity. In some cases, DS ADCs have been adapted to meet precision concerns by providing increased control over errors and/or noise. For example, for applications with an emphasis on noise shaping, a higher order DS modulator may be used, i.e., more integrators and feedback paths are used in the loop filter for shaping even more of the quantization noise to high frequencies. Delta-sigma ADCs (e.g., FIG. 1) use the shaping of quantization noise combined with oversampling to trade off resolution with signal bandwidth. High-order noise shaping and multi-bit implementations allow for more aggressive tradeoffs, but at the risk of making the ADC unstable.

Multi-stage noise shaping (MASH) ADCs having multiple DS ADCs have been introduced. Generally speaking, MASH ADCs has a plurality of stages, e.g., a plurality of DS ADCs. In one example, a MASH ADC can have two stages, e.g., a front end and a back end. Each of the stages receive a respective analog input and outputs a respective digital output. In some cases, the stages receive the same analog input. In some cases, the stages receive different analog inputs. For instance, some MASH ADCs have a front-end and a back-end where inputs to each modulator differ. Some MASH ADCs have stages where the implementation of the stage may differ. MASH ADCs address the issue of instability by relying on the cascading of individually stable delta-sigma modulators. However, MASH ADCs rely on the cancellation of quantization noise, which requires accurate matching between analog and digital transfer functions.

Generally speaking, MASH ADCs can include a plurality of stages (cascaded delta-sigma modulators) for digitizing the signal and errors of the system in order to meet design requirements related to bandwidth, resolution, and the signal to noise ratios. One advantage of MASH ADCs is that the design cascades stable low-order loops while achieving good performance of (potentially unstable) higher-order loops. In one example, the first stage generates, from the analog input signal, a digital output signal using a first ADC. The input to the quantizer in the first stage (or equivalently, the output from the first loop filter/integrator) can be subtracted from the first DAC analog output to yield the first stage quantization noise. The first stage quantization noise is digitized by the second stage. The result is that the first stage generates an analog signal representing its quantization noise, and the second stage quantizes the quantization noise of the first stage using a second ADC. The multi-stage approach allows the quantization noise to be reduced and thus allows the MASH ADC to achieve higher performance. If more stages are used, the input to the quantizer in the second stage (or equivalently, the output from the second loop filter or integrator) can be subtracted from the second DAC analog output to yield the second stage quantization noise which can be in turn quantized by a third stage. Input to the quantizer or output from the loop filter/integrator may be delayed by a delay element prior to the subtraction. The delay element can be provided to match possible transconductance and group delay of a signal path used for generating the DAC analog output from the analog signal at the input of the delay element. To generate the final output of the MASH ADC, the respective outputs are combined. Effectively, the result is that the quantization noise of the first stage is suppressed by the second stage, and the quantization noise from the second stage is suppressed by the third stage (yielding the same suppression of noise as a single third-order loop, when three cascaded first-order loops are used).

Figure 3:
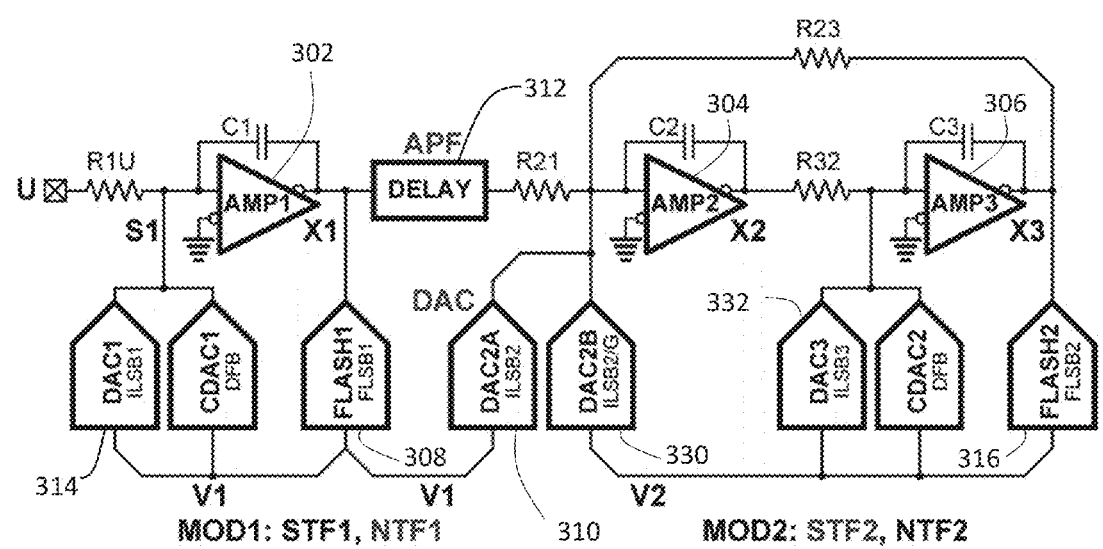
FIG. 3 is an illustrative system diagram of a 1-2 continuous time multi-stage noise shaping delta-sigma analog-to-digital converter (CT MASH ADC), according to some embodiments of the disclosure.

FIG. 3 is an illustrative system diagram of a 1-2 continuous time multi-stage noise shaping delta-sigma analog-to-digital converter (CT MASH ADC), according to some embodiments of the disclosure. In this example, the CT MASH ADC has two stages: a first order delta-sigma modulator as the first stage (or front end, referred as $MOD_1$), and a second order delta-sigma modulator as the second stage (or back end, referred as $MOD_2$). The first stage (or front end) generates a first digital output V1. The second stage (or back end) generates a second digital output V2. The order of the delta-sigma modulator is determined by the number of integrators (number of feedback loops) in the stage. The first stage (front end) has only one integrator (e.g., integrator having opamp AMP1 302 generating output signal X1), thus it is a first order modulator. The second stage (back end) has two integrators (e.g., integrator having amplifier opamp AMP2 304 generating output X2, and integrator having opamp AMP3 306 generating output X3), thus it is a second order modulator. While this example is a 1-2 CT MASH ADC, the present disclosure is applicable to a variety of converters, including other CT MASH ADC architectures, discrete time (DT) MASH ADC architectures, hybrid CT-DT MASH ADC architectures, and CT, DT, or hybrid CT-DT pipelined modulators, etc.

Referring back to FIG. 3, the residue of the coarse quantization provided by a first quantizer (shown as "FLASH1" 308) inside the first order front end is fed to the second order back end and gets digitized by the second order back end. The second order back end has a second quantizer (shown as "FLASH2" 316) to generate digital output V2. The output of the integrator in the first order front end (or input to the quantizer "FLASH1" 308), X1, is digitized by "FLASH1" 308 to generate digital output V1. The output of the integrator in the second order back end (or input to the quantizer "FLASH2" 316), X3, is digitized by "FLASH2" 316. "FLASH1" 308 and "FLASH2" 316 can be implemented based on the illustration shown in FIG. 2.

Digital output V1 is provided as input to DAC "DAC2A" 310 to generate an analog output signal. The difference between X1 (or a delayed version of X1 at the output of the delay element 312) and the DAC2A 310 analog output yields the residue of the coarse quantization. The delay element 312 can be provided match possible transconductance and group delay of a signal path used for generating the DAC2A 310 analog output, i.e., the path through FLASH1 308 and DAC2A 310. The digital output of the front end V1 and the digital output of the back end V2 are properly combined in digital domain as the final digital word of the 1-2 CT MASH ADC.

Errors in the Quantizer

Referring back to the quantizer in FIG. 2, manufacturing imperfections can cause a comparator to compare the analog signal x to a different value than the desired reference voltage value provided to the comparator. Such deviation from ideal or desired value is called an offset. Offsets can increase quantization noise of the quantizer, which is usually a function of the resolution of the quantizer. Furthermore, offsets in the circuitry may drift due to aging, temperature, and voltage/supply variations. While delta-sigma ADCs and MASH ADCs can shape quantization noise to higher frequencies, quantization noise still consumes a significant portion of the noise budget, even when a higher resolution quantizer is used.

Some calibration system operates in the foreground where the input to the delta-sigma ADC is disconnected. The comparator offset correction codes are adjusted so that the total power of the delta-sigma ADC's output (made up primarily of quantization noise) is minimized. Since comparators offsets increase quantization noise, minimizing quantization noise is equivalent to minimizing comparator offsets. The calibration cannot be performed with a large input applied to the ADC because such signals would corrupt the power measurement. Since calibration cannot be done in the presence of an input signal, the calibration system cannot track drifts of comparator offsets due to aging, supply, or temperature variation. The algorithm for minimizing quanization noise can reach a local minimum but may not necessarily reach a global minimum. Some calibration systems operate in the background with a pair of choppers that are controlled by a random signal. This technique is difficult to implement in high-speed circuit designs because the choppers slow down the comparator, and for a delta-sigma ADC, any speed impediment in the quantizer can degrade the stability of the loop.

Improved Calibration Scheme for Comparator Offsets

Comparator offsets in the quantizer or flash ADC of a delta-sigma ADC can be estimated by computing the mean of each comparator, i.e., the mean of each comparator output. The relative differences in the means can estimate the offsets of the comparators. When a shuffler with random element selection is used to shuffle signal paths of the quantizer (e.g., shuffling reference voltages to the comparators), the offset measurement would not be disturbed by the presence of an input signal. Therefore, the shuffler allows the offset measurement to be performed in the foreground (with the input to the delta-sigma ADC being disconnected) and in the background (without interrupting the normal operation of the ADC). The present disclosure describes various in-situ flash offset calibration systems for delta-sigma ADCs, such as continuous-time delta-sigma ADCs (CT DS ADCs). One of the systems is a background calibration scheme that can track offsets drifts due to aging, temperature, and voltage shifts. Another one of the systems is a foreground calibration scheme that can generate more consistent calibration codes than other foreground calibration schemes.

Figure 4:
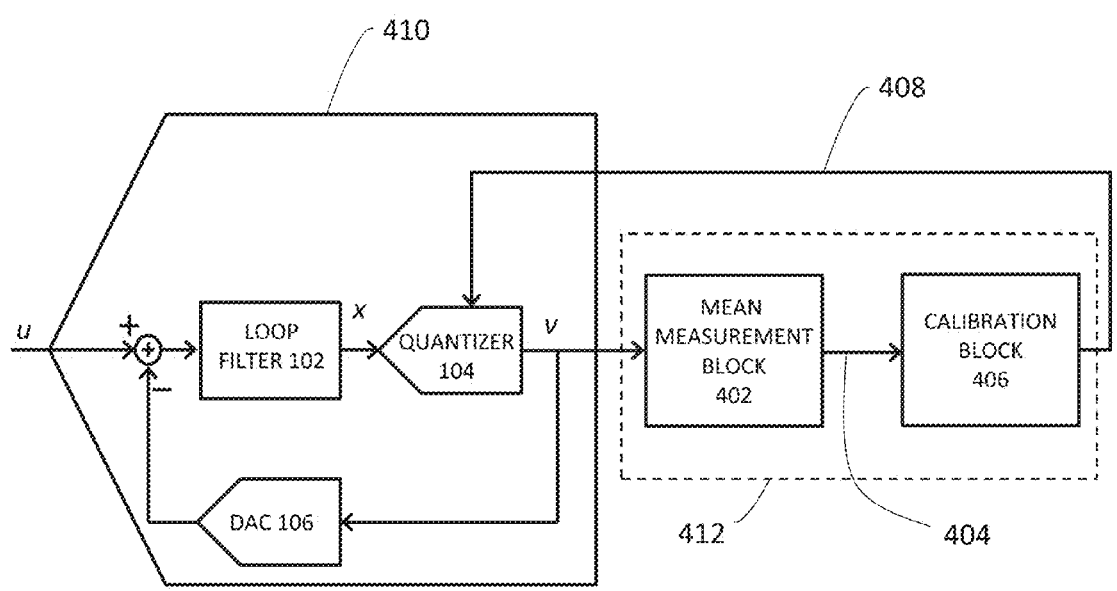
FIG. 4 shows an illustrative delta-sigma ADC having a quantizer and an exemplary calibration system, according to some embodiments of the disclosure.

FIG. 4 shows an illustrative delta-sigma ADC 410 having a quantizer 104 and an exemplary calibration system 412, according to some embodiments of the disclosure. Broadly, the quantizer 104 is referred herein as an internal analog-to-digital converter. The calibration system 412 can include mean measurement block 402 and calibration block 406.

The mean measurement block 402 computes a mean value for each comparator output in the internal analog-to-digital converter. The internal analog-to-digital converter, e.g., quantizer 104, has signal paths which are shuffled. Due to the shuffling of the signal paths, calibration is no longer affected by the input signal to the delta-sigma ADC 410 or the presence of said input signal. With shuffling, outputs across the comparators of the internal analog-to-digital converter are expected to be roughly the same or equalized when each output is averaged over time if the internal analog-to-digital converter has no offsets. By examining the averages of each comparator, it is possible to estimate offsets of the comparators and determine whether the comparators are deviating from their ideal operating points. Output v from quantizer 104 can include outputs from a plurality of comparators in quantizer 104. Measurement block 402 receive the outputs from the comparators in quantizer 104, and can include dedicated digital circuitry for calculating a mean or average value based on samples of an output from a particular comparator of the quantizer 104 (based on samples collected over time).

The calibration block 406 determines offset calibration codes based on the mean values computed by the mean measurement block 402, wherein the offset calibration codes are used to adjust comparator offsets in the internal analog-to-digital converter, e.g., quantizer 104. Calibration block 406 can receive the mean/average values 404 computed by measurement block 402 and compute offset calibration codes 408 to program offsets in quantizer 104. Calibration system 412 can provide programmable offset calibration in quantizer 104.

In some embodiments, at least a part of the calibration system 412 is implemented using custom digital logic. For instance, the mean measurement block 402 can be implemented by digital logic on-chip with the analog-to-digital converter (e.g., delta-sigma ADC 410) having the internal analog-to-digital converter (e.g., quantizer 104). In some cases, both the mean measurement block 402 and the calibration block 406 are implemented as digital logic on-chip with an analog-to-digital converter having the internal analog-to-digital converter. Custom digital logic can perform calibration computations at high speeds and low power.

In some embodiments, at least a part of the calibration system 412 is implemented in an on-chip processor. Embedding a processor, or microprocessor that can execute instructions stored on-chip is no longer prohibitively expensive, and it may be desirable to implement some of the calibration computations in the on-chip microprocessor. For instance, the calibration block 406 can be implemented in a programmable microprocessor embedded on-chip with an analog-to-digital converter (e.g. delta-sigma ADC 410) having the internal analog-to-digital converter (e.g., quantizer 104) configured to execute instructions that determines the offset calibration codes. Advantageously, instructions implementing the calibration computations can be updated, changed, and/or selected based on one or more conditions of the analog-to-digital converter, e.g., input conditions, temperature conditions, voltage conditions, aging conditions. Fuses and/or input pins can also be used to select certain instructions to use for calibration, e.g., based on the application of the delta-sigma ADC. A microprocessor can also be more effective or efficient at scheduling and controlling calibration than custom digital logic. One or more memory elements or buffers can be provided on-chip or off-chip to store samples or data to be processed by the on-chip processor for calibrating the internal analog-to-digital converter. One or more memory elements can be provided on-chip to store calibration offset codes usable for adjusting the offsets in the internal analog-to-digital converter.

Figure 5:
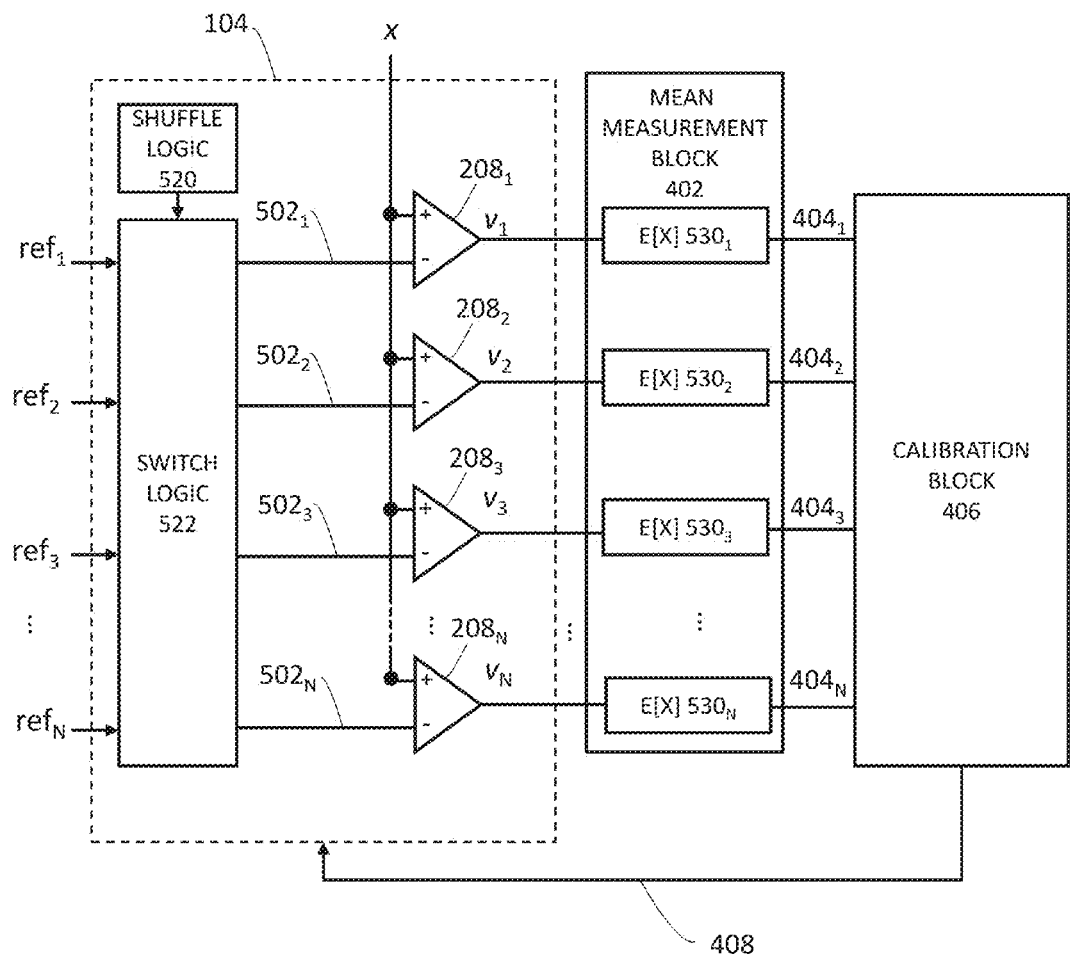
FIG. 5 shows a more detailed view of the illustrative delta-sigma ADC and exemplary calibration system of FIG. 4, according to some embodiments of the disclosure.
Figure 6A:
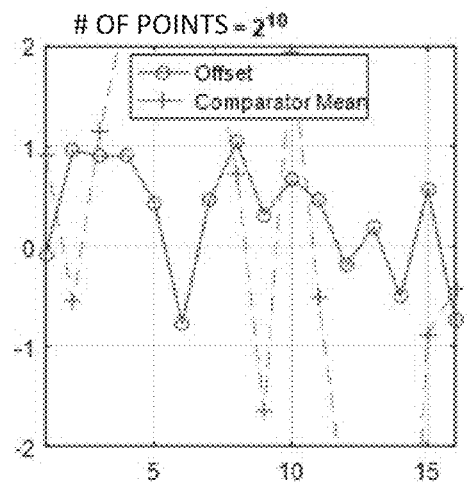
FIGS. 6A-L show simulated results comparing actual offsets and measured means of the comparator outputs based on different number of samples being taken, according to some embodiments of the disclosure.
Figure 6B:
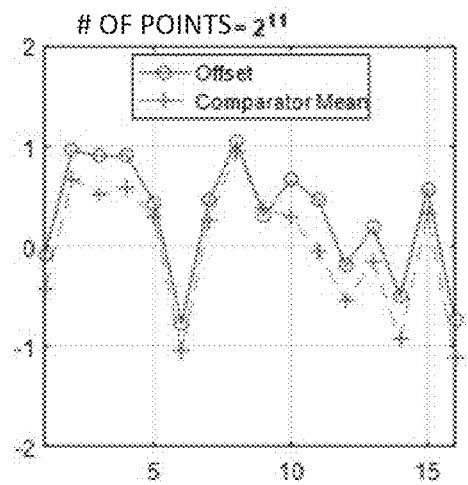
Figure 6C:
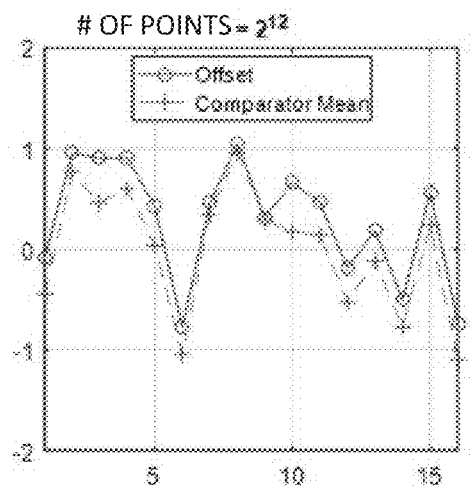
Figure 6D:
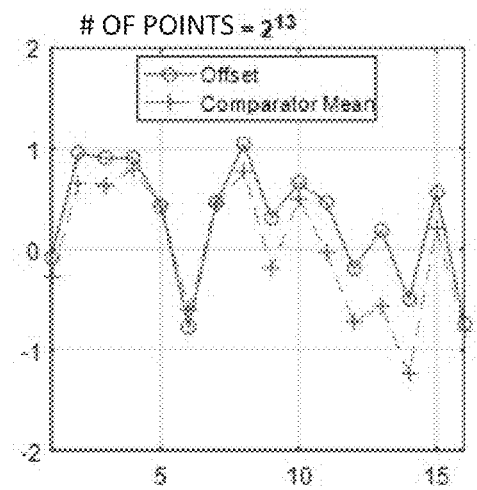
Figure 6E:
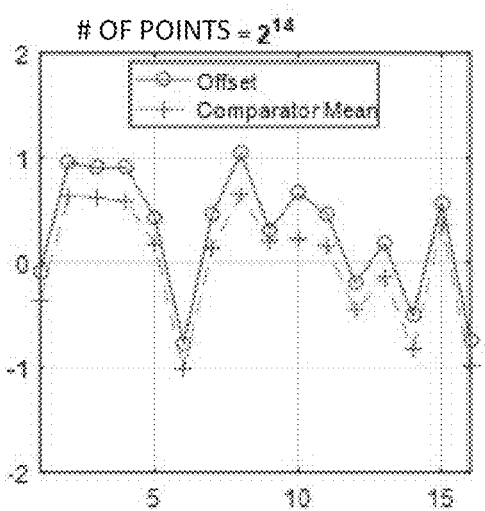
Figure 6F:
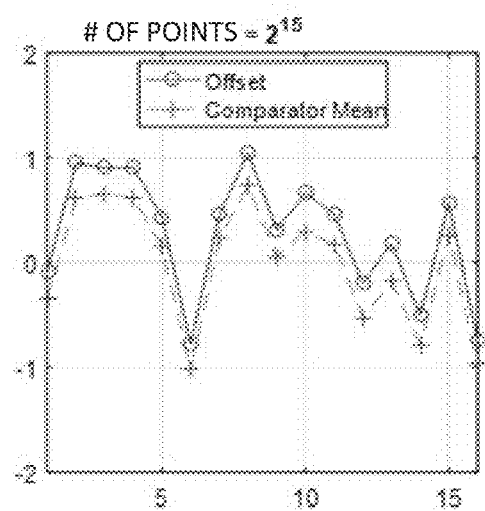
Figure 6G:
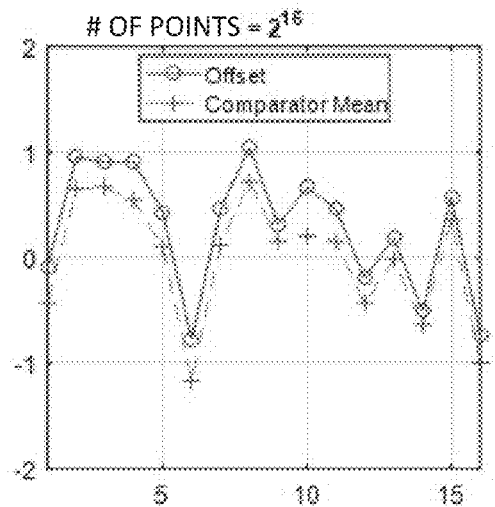
Figure 6H:
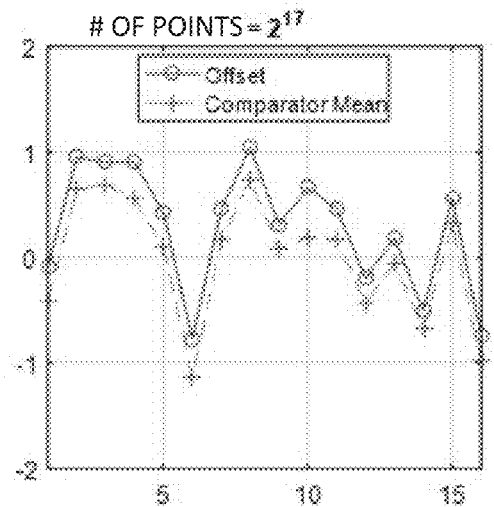
Figure 6I:
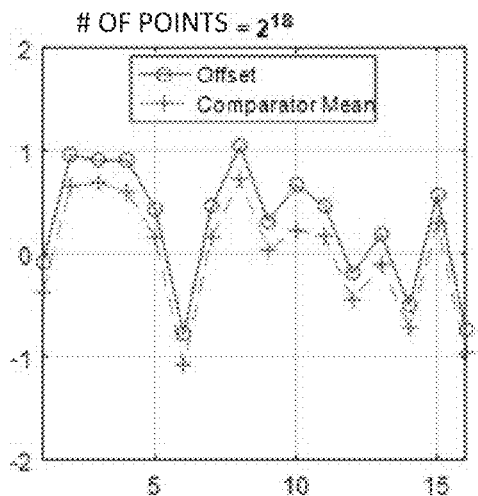
Figure 6J:
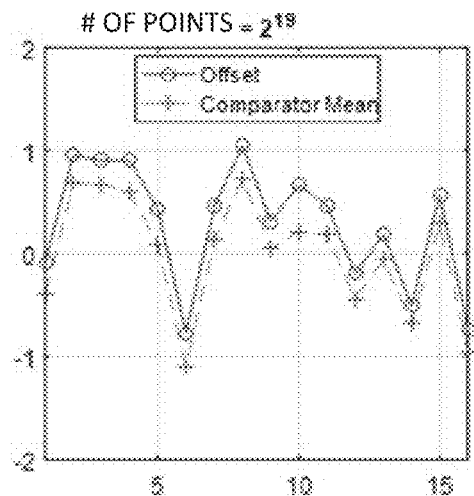
Figure 6K:
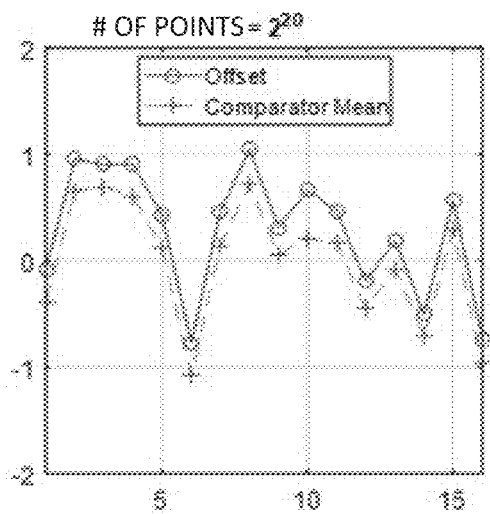
Figure 6L:
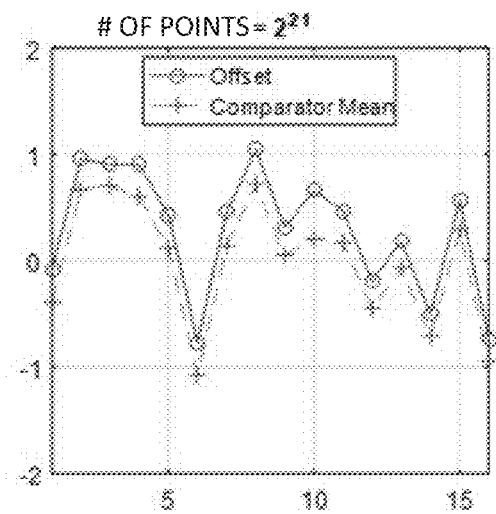
Figure 7A:
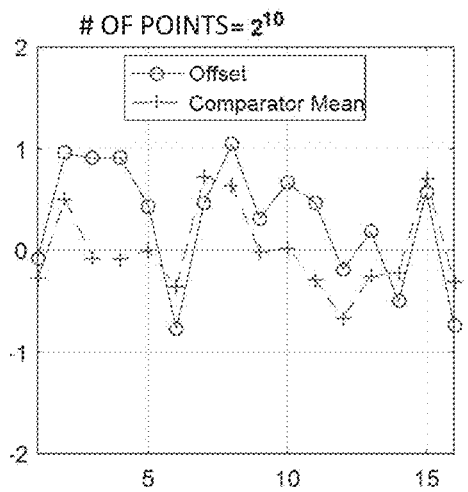
FIGS. 7A-L show simulated results comparing actual offsets and measured means of the comparator outputs based on different number of samples being taken, where the simulated results do not take into account an effect of the shuffler on the measured means, according to some embodiments of the disclosure.
Figure 7B:
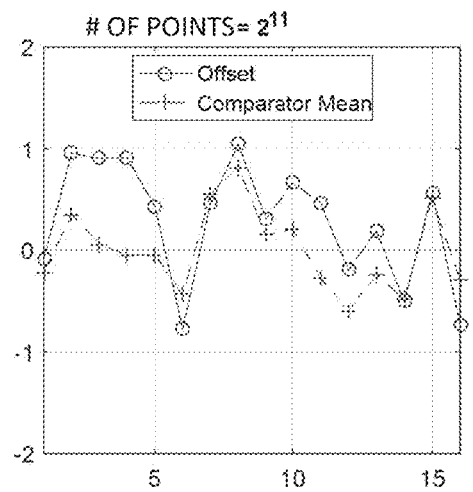
Figure 7C:
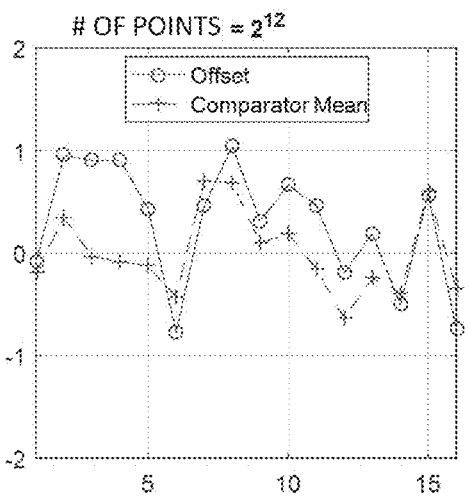
Figure 7D:
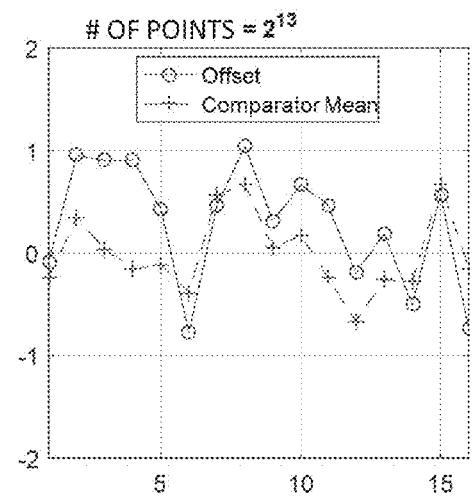
Figure 7E:
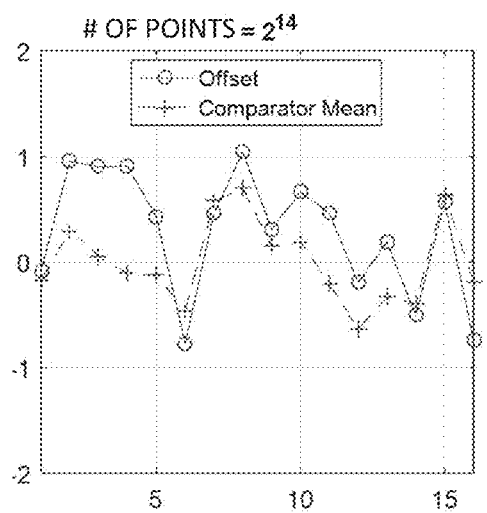
Figure 7F:
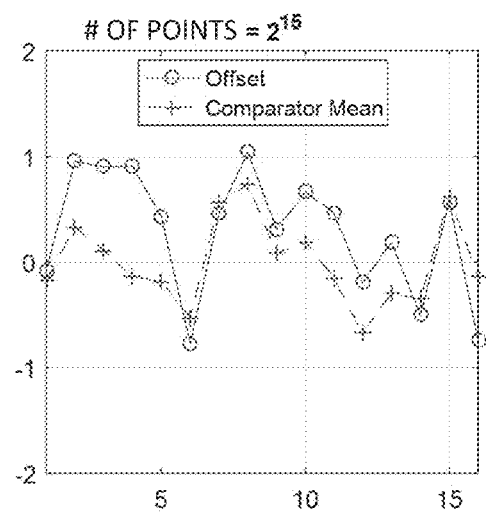
Figure 7G:
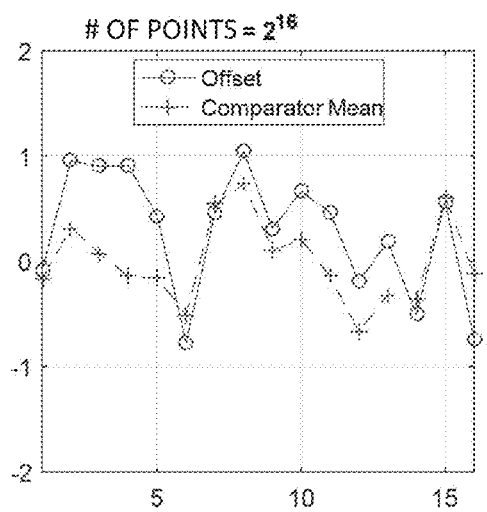
Figure 7H:
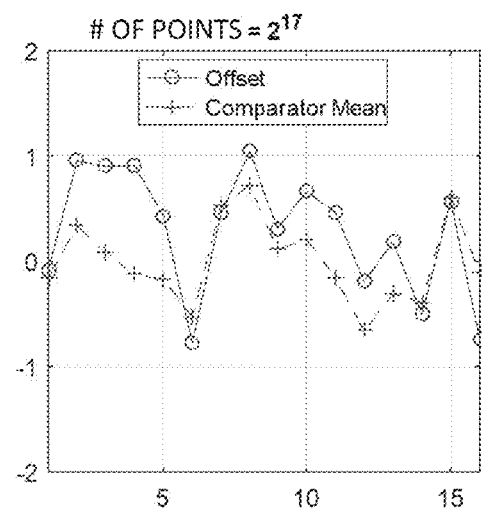
Figure 7I:
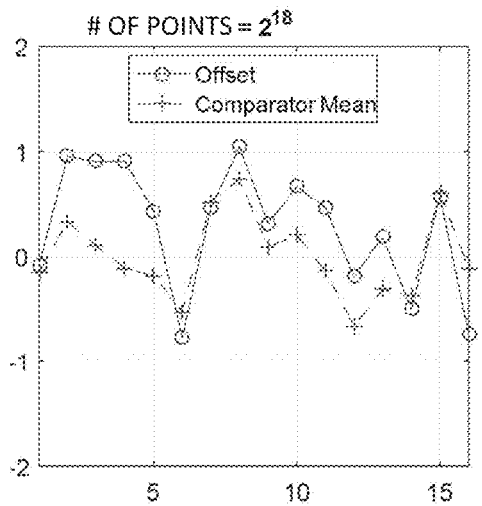
Figure 7J:
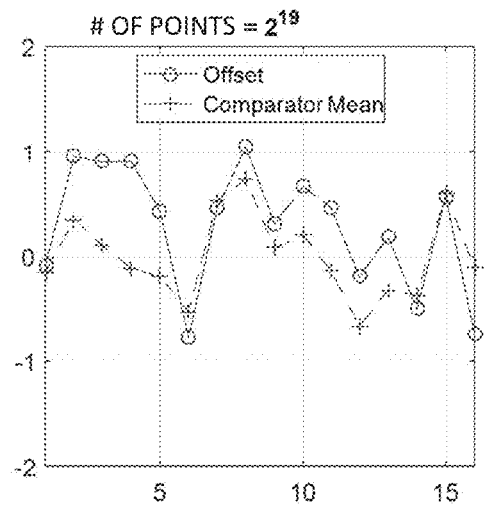
Figure 7K:
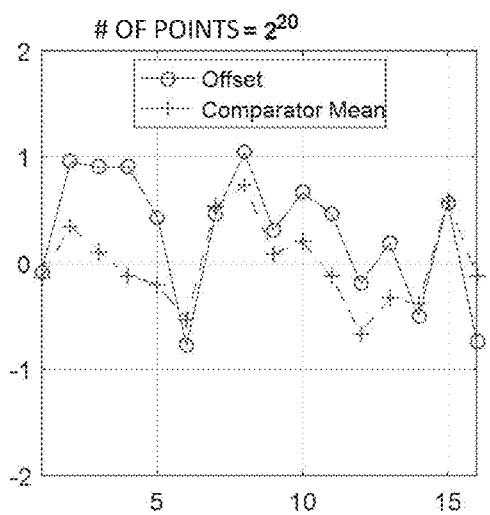
Figure 7L:
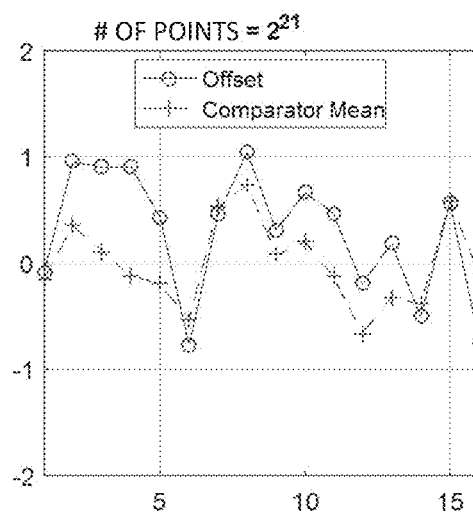

FIG. 5 shows a more detailed view of the illustrative delta-sigma ADC and exemplary calibration system of FIG. 4, according to some embodiments of the disclosure. Examining the details of the quantizer 104 (i.e., the internal analog-to-digital converter) more closely, the quantizer 104 includes shuffle logic 520 and switch logic 522. Shuffle logic 520 can control switch logic 522 (e.g., configures a switch matrix) to shuffle reference voltages $ref_1$, $ref_2$, $ref_3$, ... $ref_N$ being provided as reference inputs $502_1$, $502_2$, $502_3$, ... $502_N$ to N comparators $208_1$, $208_2$, $208_3$, ... $208_N$. Reference voltages $ref_1$, $ref_2$, $ref_3$, ... $ref_N$ can be generated with a resistor ladder as seen in FIG. 2. The N comparators $208_1$, $208_2$, $208_3$, ... $208_N$ compare the analog signal x (from loop filter 102) against respective reference inputs $502_1$, $502_2$, $502_3$, ... $502_N$ and generate respective outputs $v_1$, $v_2$, $v_3$, ... $v_N$. An output of a particular comparator indicates whether the analog signal x is greater than or less than the reference input being received by the particular comparator. The shuffle logic 520 and switch logic 522 shuffles signal paths of the internal analog-to-digital converter, e.g., quantizer 104, and the shuffling ensures that comparators of the internal analog-to-digital converter experiences substantially a same number of transitions over time. The shuffle logic 520 and switch logic 522 can shuffle the reference voltages $ref_1$, $ref_2$, $ref_3$, ... $ref_N$ in a deterministc or pseudorandom fashion such that every comparator would be connected to every reference voltage for an equal amount of time, on average. When every comparator is connected to every reference voltage and if the N comparators $208_1$, $208_2$, $208_3$, ... $208_N$ are ideal, averages of comparator outputs are expected to be the same given enough samples are taken of the comparator outputs, no matter the analog input x. In other words, with enough samples, the means of the comparators should be the same if there are no offsets in the internal analog-to-digital converter (e.g., no offsets of comparators $208_1$, $208_2$, $208_3$, ... $208_N$ in quantizer 104). Mean measurement block 402 can include one or more averaging blocks E[X] $530_1$, $530_2$, $530_3$, ... $530_N$. An averaging block receives a comparator output and averages samples of the comparator output over many samples. In other words, the averaging block can find the mean of a comparator output. In some cases, an averaging block is used for or shared among a plurality of comparators in the quantizer 104, so it is not necessary to have N averaging blocks. With appropriate switching, an averaging block can be used to compute average comparator outputs for more than one comparator (similar to time-division multiplexing). An averaging block can include one or more of the following: a digital counter, a digital adder, and an accumulator. Depending on the possible levels of the comparator outputs, the averaging block can be implemented differently. The mean of each comparator output in the internal analog-to-digital converter is computed by the mean measurement block 402 and provided to the calibration block 406 (represented by $404_1$, $404_2$, $404_3$, ... $404_N$).

The calibration block 406 computes offset calibration codes 408. In some embodiments, the calibration block 406 determines offset calibration codes based on relative differences between the mean values. The offset calibration codes 408 can be determined to drive the means of the comparator outputs as close to each other as possible. An input signal to the delta-sigma analog-to-digital converter would only affect the mean of all the comparators equally due to shuffling, and thus the input signal would not have an impact on the measurement itself. In some embodiments, the offset calibration codes 408 can control reference correction currents in the internal analog-to-digital converter 104. Each reference correction current changes an average comparator output to compensate for any estimated offsets present in the internal analog-to-digital converter 104. With appropriate offset calibration codes 408, the average comparator outputs can be equalized and undesirable offsets of the comparators relative to each other can be compensated for. As a result, the quantization noise of the internal analog-to-digital converter 104 is reduced, and the overall performance of the delta-sigma ADC is improved as a result.

Estimating Offsets and Taking into Account Shuffler's Effect on the Measurements FIGS. 6A-L show simulated results comparing actual offsets and measured means of the comparator outputs based on different number of samples being taken, according to some embodiments of the disclosure. For illustration, the internal analog-to-digital converter is a 17-level flash ADC, having 16 comparators. The internal analog-to-digital converter is in an exemplary low-pass continuous-time delta sigma ADC with no input applied. The actual offsets of the different comparators are simulated, and the comparator means are measured over many samples. Each FIG. 1n the set of FIGS. 6A-L shows the comparator means computed from $2^{10}$ up to $2^{21}$ points (indicated by "# OF POINTS=") by the mean measurement block having one or more averaging blocks. In this simulation, the mean measurements become accurate (e.g., more or less matching the simulated offsets) when averages are taken from $2^{14}$ points or samples. In some embodiments more than $2^{16}$ points or samples is recommended.

A low-pass delta-sigma ADC can significantly attenuate direct current (DC) errors, also referred to as static errors, at the input of the internal analog-to-digital converter. The constant shift between the actual and measured mean is observed from the results since a non-zero mean comparator offset is equivalent to a DC signal added to the internal analog-to-digital converter.

Figure 8:
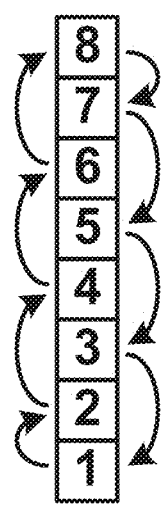
FIG. 8 shows an exemplary shuffler pattern of eight comparators, according to some embodiments of the disclosure.

The measured means of the comparator outputs in plots seen in FIGS. 6A-L were generated with corrections that take into account the limited number of shuffler patterns that can be generated with the ADC's reference switch matrix (e.g., generated by shuffle logic 520 on switch logic 522 of FIG. 5). FIGS. 7A-L show simulated results comparing actual offsets and measured means of the comparator outputs from $2^{10}$ up to $2^{21}$ points (indicated by "# OF POINTS="), where the simulated results do not take into account an effect of the shuffler on the measured means, according to some embodiments of the disclosure. In other words, correction for an effect of the shuffler on the measured means is not applied. By inspection of FIGS. 7A-L, there exists a discrepancy between the actual and measured offsets which is not improved by increasing the number of samples. This discrepancy may come from the shuffler not being purely random, and in some cases, the shuffler shuffles a comparator and its second neighbors mostly in the same direction. FIG. 8 shows an exemplary shuffler pattern of eight comparators, according to some embodiments of the disclosure. It can be seen that the shuffler pattern may consistently shuffle a certain reference (which, in effect, shuffles a signal path) and its second neighbors in the same direction. This behavior of the shuffler may affect the mean measurements, since the assumption is the shuffler is purely random. The pseudo-randomness or non-purely random shuffling pattern can have an effect on the measured means. It is still possible to reduce offsets in the internal analog-to-digital converter without such corrections. However, the corrections on the measured means taking into account the effect of the shuffler would result in a more accurate offset calibration scheme.

Figure 9A:
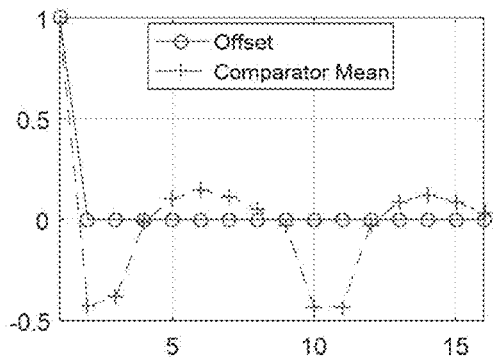
FIGS. 9A-P illustrates an impulse response of a shuffler, according to some embodiments of the disclosure.
Figure 9B:
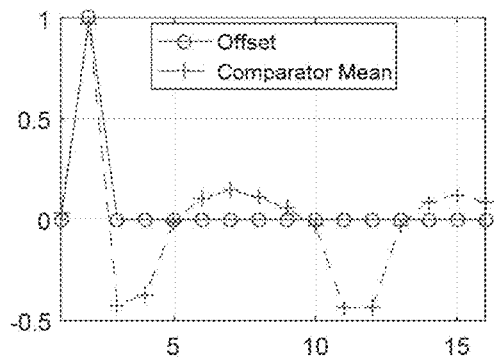
Figure 9C:
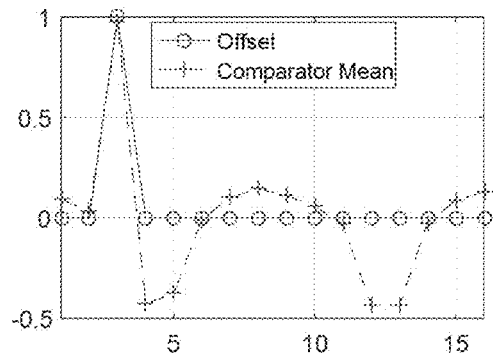
Figure 9D:
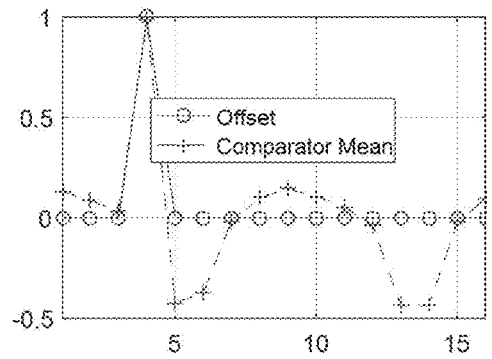
Figure 9E:
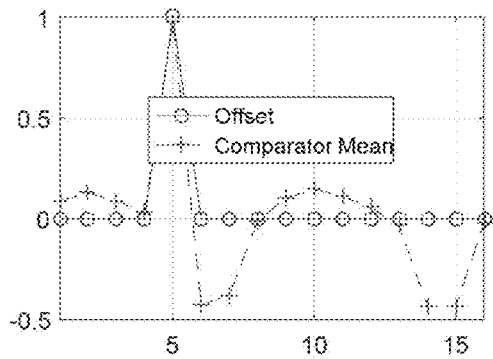
Figure 9F:
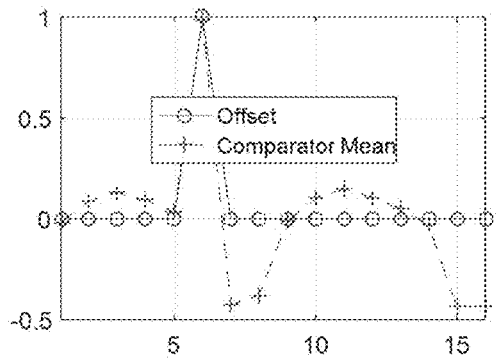
Figure 9G:
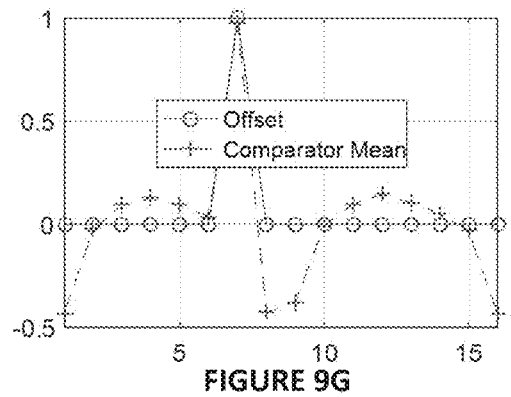
Figure 9H:
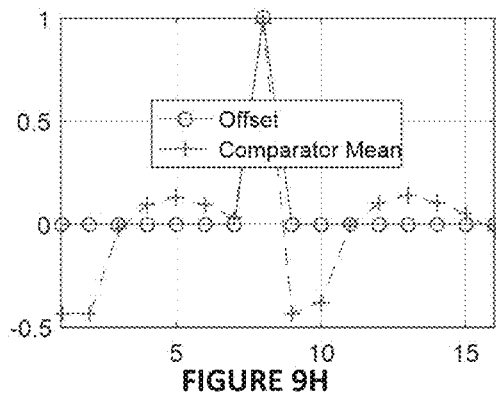
Figure 9I:
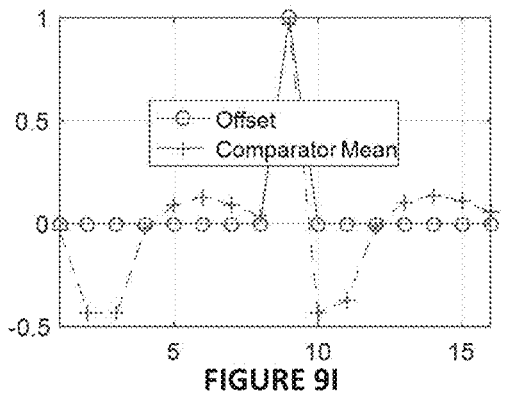
Figure 9J:
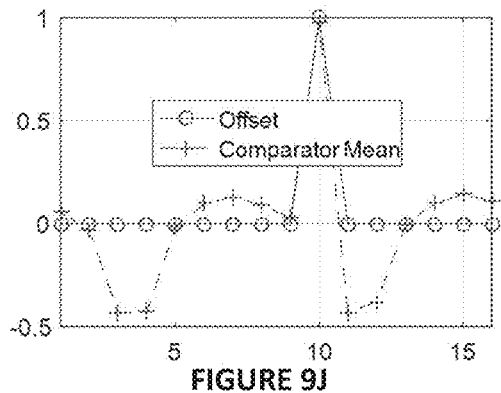
Figure 9K:
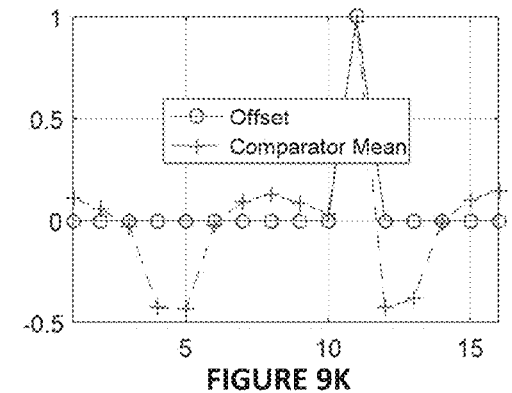
Figure 9L:
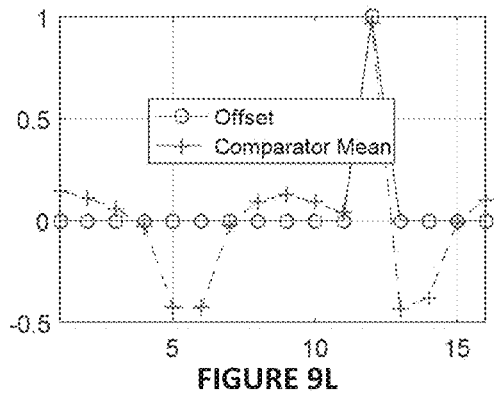
Figure 9M:
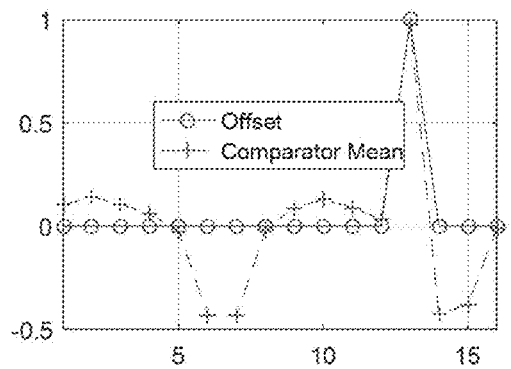
Figure 9N:
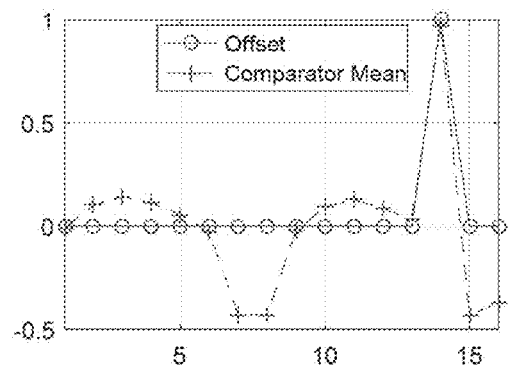
Figure 9O:
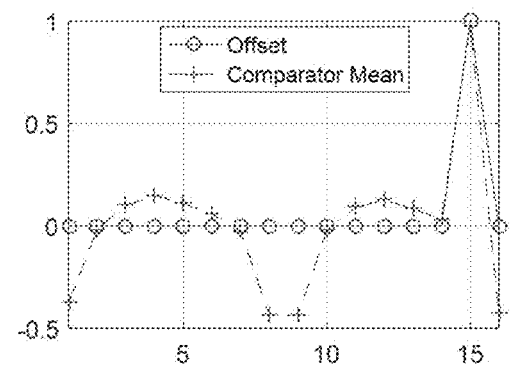
Figure 9P:
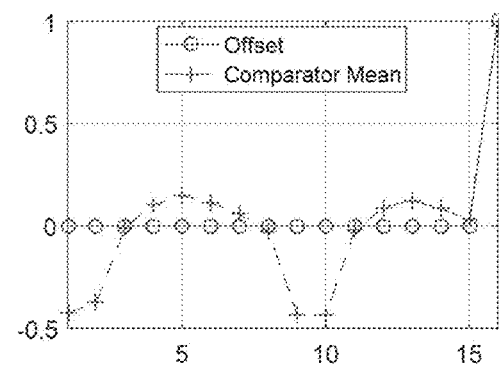

This measurement discrepancy can be corrected by obtaining the impulse response matrix of the shuffler. FIGS. 9A-P illustrates an impulse response of a shuffler, according to some embodiments of the disclosure. In the context of this document, the impulse response matrix is represented by the plots seen in FIGS. 9A-P. Each plot shows the measured mean of each comparator when only one comparator has an offset. In simulation, one comparator is set to have an offset of 1 unit of correction code and the mean of each comparator output is measured. Each set of comparator means where only one comparator is set to have an offset forms an impulse response vector. All the impulse response vectors together form the impulse response matrix. In other words, the results from the plots of FIGS. 9A-P are combined to generate an impulse response matrix of the shuffler. In a perfectly shuffled system, only the comparator with the offset would have a non-zero mean. However, because of the fixed number of shuffle states, multiple comparators would show a non-zero mean (as seen in the plots of FIGS. 9A-P) even if only one comparator has an offset. As seen in FIGS. 9A-P, the impulse response is linear with the pattern shifted to the comparator with the offset. To correct for the effect of the shuffler on the measured means, the measured data is multiplied by the inverse of the impulse response matrix generated based on the plots. Mathematically, it can be shown that the uncorrected (observed or measured) comparator mean is related to the actual (corrected) comparator offset by:

$$Ax=B \qquad (1)$$

x is the actual comparator offset vector (a vector having actual comparator offsets), A is the impulse response matrix (a matrix having all the impulse response vectors) and B is the uncorrected comparator mean vector (a vector having measured means of comparator outputs). For a 17-level internal analog-to-digital converter, the dimension of x, A, and B are 16×1, 16×16, and 16×1, respectively. Once the impulse response matrix A has been obtained, the offset x can be computed by:

$$x=A^{-1}B \qquad (2)$$

Multiplying the uncorrected comparator mean vector B with the inverse of the impulse response matrix $A^{-1}$ would yield the actual comparator offset vector x. The actual comparator offset vector x can be used to determine offset correction codes that would calibrate and compensate for the offsets in the internal analog-to-digital converter. Such an operation was used to generate corrected comparator means seen in FIGS. 6A-L from the uncorrected comparator means seen in FIGS. 7A-L. Referring back to FIGS. 4 and 5, by changing the offset code, the calibration block can further determine an impulse response matrix corresponding to the shuffling of signal paths and applies an inverse of the impulse response matrix to the mean values prior to determining the offset calibration codes.

The inverse impulse response matrix (or correction matrix) for the shuffler-dependent pattern can be pre-computed and stored in non-volatile memory of the analog-to-digital converter ("the chip") having the internal analog-to-digital converter to be calibrated. In some cases, the inverse impure response matrix can be computed in-situ on the chip during power-up. It has been observed that the correction matrix is sensitive to input amplitude and shuffle pattern.

In some embodiments, the inverse of the impulse response A can be computed with the inv( ) function, such as the inv( ) in Matlab. With this function, the elements of the inverse matrix were large (in the order of 10 thousands) and the computation to obtain the offset x from the measured comparator mean B relied to the cancellation of very large numbers (i.e. 1000.1-999.9=0.2). This leads to very sensitive measurements where a small change in the B can cause a large change in x. The sensitive problem is caused by the fact that a delta-sigma modulator rejects offsets that are common to all comparators. Common comparator offsets manifest as static errors in the modulator. This means that the A matrix will have no DC gain. When the inverse A matrix is computed, the DC gain can be extremely high. This problem can be solved by adding a row of 1s to the A matrix. This row forces the mean of the computed offset vector x from the $A^{-1}B$ to be 0. In other words, it forces the DC gain of the inverse A matrix to be 0. Since the modified A matrix is no longer square (17×16), its inverse cannot be computed directly. Instead, one can use the pseudo-inverse function pinv( ), such as pinv( ) in Matlab to obtain the Moore-Penrose pseudoinverse and stripping out the last column. Alternatively, one can use the "A \ eye(16)" command in Matlab to obtain a similar matrix to the Moore-Penrose pseudoinverse.

Exemplary Calibration Methods

Figure 10:
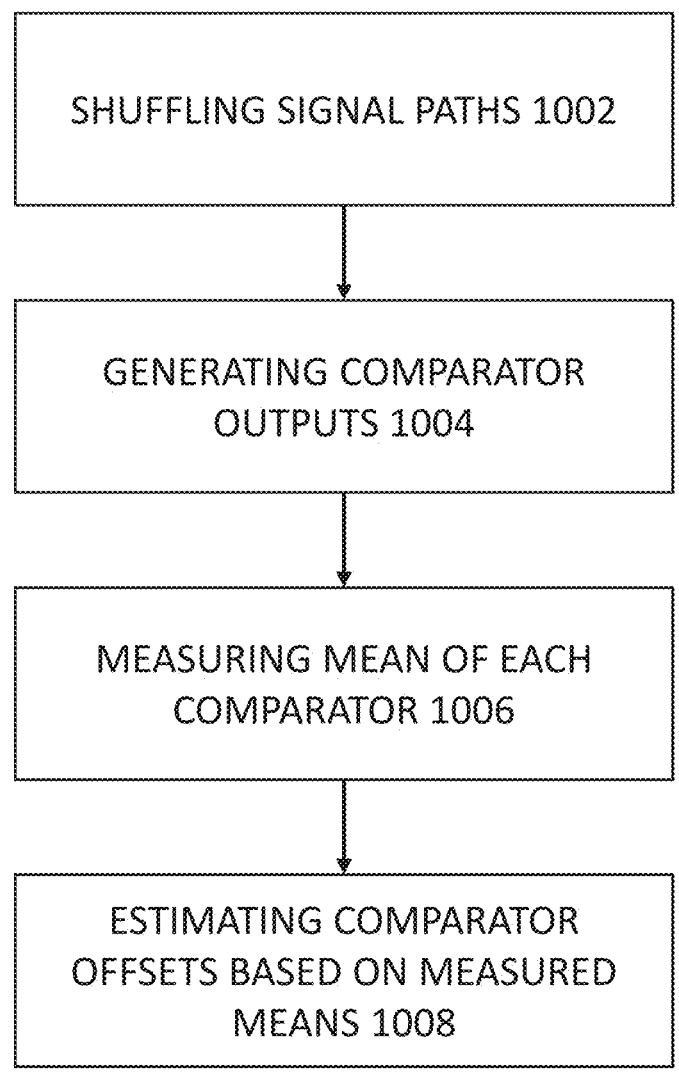
FIG. 10 illustrates an exemplary method for calibrating an internal analog-to-digital converter, according to some embodiments of the disclosure.

FIG. 10 illustrates an exemplary method for calibrating an internal analog-to-digital converter, according to some embodiments of the disclosure. In 1002, signal paths of an internal analog-to-digital converter are shuffled. Shuffling signal paths of the internal analog-to-digital converter can include shuffling reference voltages provided to comparators of the internal analog-to-digital converter. Shuffling signal paths of the internal analog-to-digital converter can ensure that comparators of the internal analog-to-digital converter experiences substantially a same number of transitions over time. In 1004, comparator outputs are generated by the analog-to-digital converter. In 1006, mean of each comparator output in the internal analog-to-digital converter is measured. Measuring the mean of each comparator output can include accumulating samples of a given comparator output to obtain the mean. In 1008, comparator offsets are estimated based on the measured means. Estimating comparator offsets can include determining relative differences between the measured means. When the signal paths are shuffled, the measured means are expected to be equal to each other if there are no offsets in the internal analog-to-digital converter.

In some embodiments, the method further includes determining an impulse response matrix corresponding to the shuffling of signal paths. Estimating comparator offsets can include applying an inverse of the impulse response matrix to the measured means prior to determining the comparator offsets, to correct for the effect of the shuffling of signal path.

In some embodiments, the method further includes adjusting the comparators based on the estimated comparator offsets. Exemplary methods for carrying out the adjustment are described herein.

Due to the presence of shuffling in the internal analog-to-digital converter, it is possible to perform the measuring of comparator means in the foreground or in the background. For a foreground scheme, the method includes disconnecting an input of an analog-to-digital converter having the internal analog-to-digital converter (e.g., delta sigma converter) prior to the generating of the comparator outputs. The internal analog-to-digital converter may "see" or receive a noise source when the input is disconnected. The measured means are still expected to be equal to each other if there are no offsets in the internal analog-to-digital converter. For a background scheme, the shuffling and the generating are performed while an input signal is provided to an input of an analog-to-digital converter having the internal analog-to-digital converter. In other words, the samples of the comparator outputs used in measuring the mean are generated during the normal operation of the analog-to-digital converter. Because the signal paths are shuffled, the measured means are still expected to be equal to each other if there are no offsets in the internal analog-to-digital converter.

Figure 11:
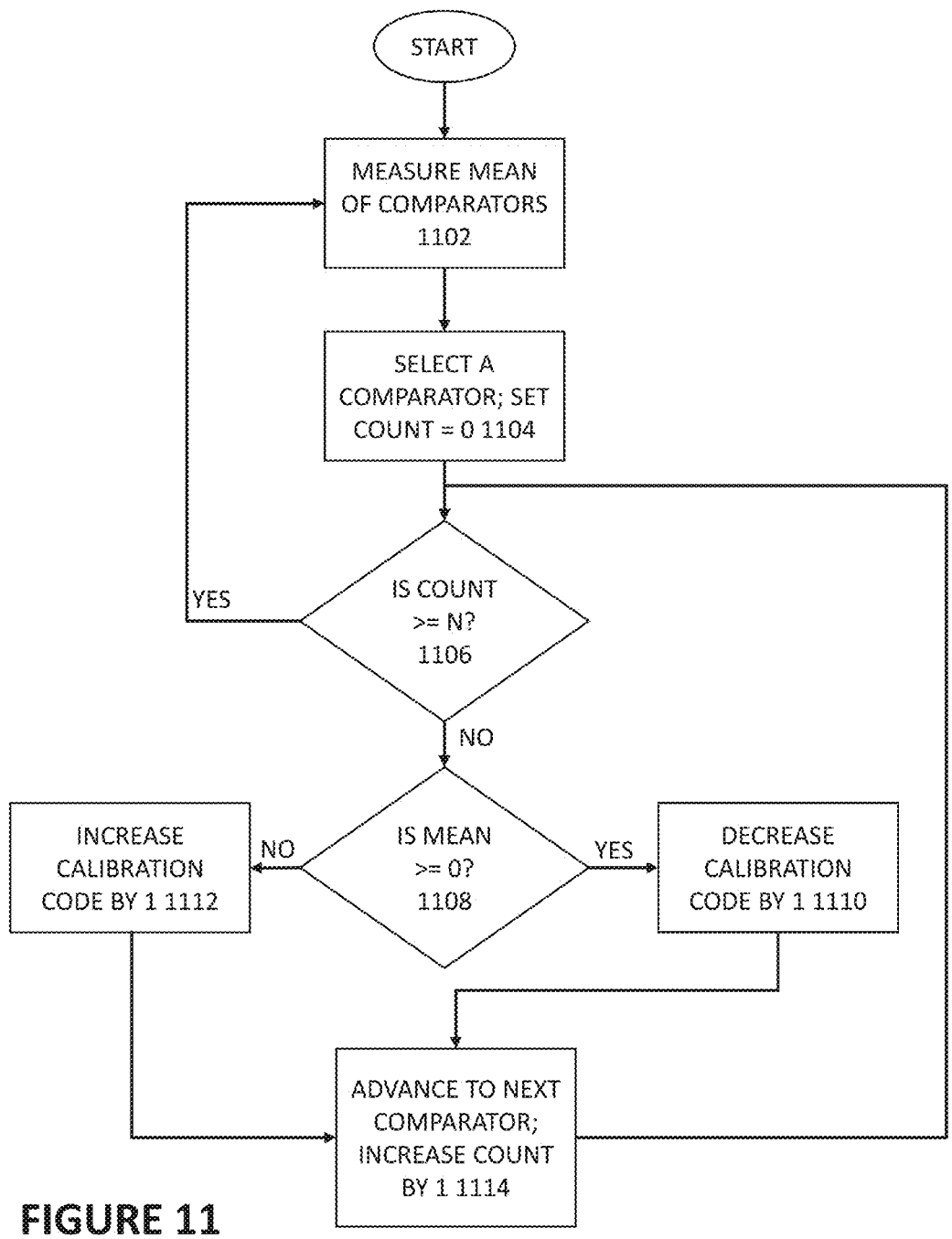
FIG. 11 illustrates another exemplary method for calibrating an internal analog-to-digital converter, according to some embodiments of the disclosure.

FIG. 11 illustrates another exemplary method for calibrating an internal analog-to-digital converter, according to some embodiments of the disclosure. The method measures the mean of each comparators and adjusts the calibration codes of each comparator so that the mean is as small as possible, or as close to zero as possible (assuming the ideal comparator mean is zero for all comparators). In 1102, the comparator outputs are sampled and means of the comparator outputs are measured. In 1104, a comparator is selected and a count or counter variable is set to zero. The loop checks, in 1106, to see if the count is equal to or greater than N, where N is the number of comparators in the internal analog-to-digital converter. If the count is less than N, the method proceeds to check whether the mean of the selected comparator is greater than or equal to zero (or the ideal measured mean). Based on the output of the check, the calibration code is incremented or decremented accordingly to drive the mean of the selected comparator closer to zero. Choice to increment or decrement the offset calibration codes depends on the implementation of the circuitry which adjusts the comparator output means. If the mean of the selected comparator is greater than or equal to zero, the method, in 1110, may decrease a corresponding offset calibration code by a nominal value or nominal step, such as 1. If the mean of the selected comparator is less than zero then the method, in 1112, may increase the corresponding offset calibration code by a nominal value or nominal step, such as 1. The method, in 1114, advances to a next comparator and increases the count by 1. The method loops back to adjust the calibration codes for other selected comparators until all the calibration codes for the rest of the comparators are adjusted. The method then returns to 1102 to measure mean of each comparator again to repeat the measurement and calibration process.

Figure 12:
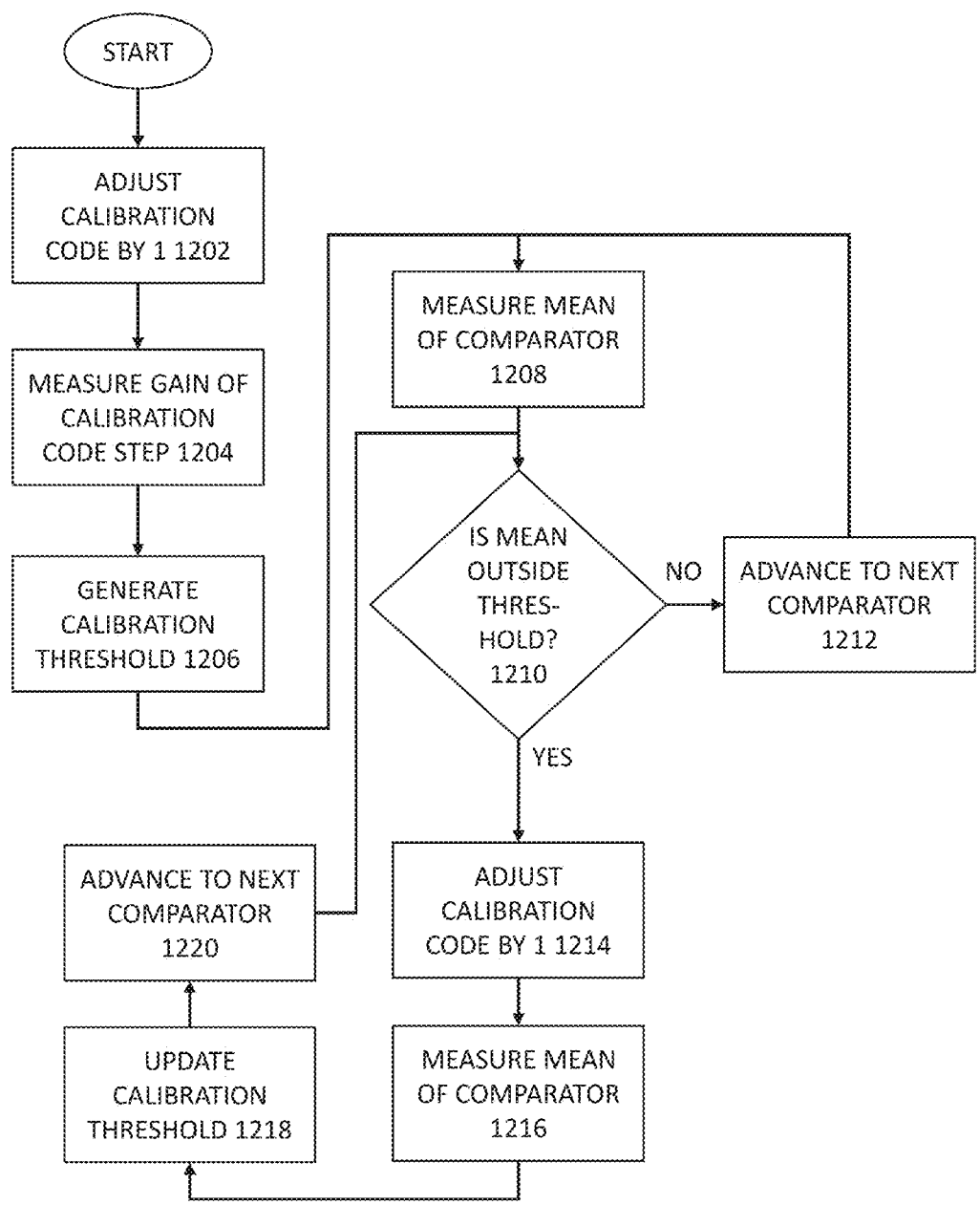
FIG. 12 illustrates yet another exemplary method for calibrating an internal analog-to-digital converter, according to some embodiments of the disclosure.

FIG. 12 illustrates yet another exemplary method for calibrating an internal analog-to-digital converter, according to some embodiments of the disclosure. The method illustrated in FIG. 12 is relatively more complex than the method illustrated in FIG. 11. Specifically, the method illustrated in FIG. 12 can advantageously compensate for aging, supply, and temperature variation. When an analog-to-digital converter having the internal analog-to-digital converter is powered on, the method can perform an initialization routine to find the gain of a calibration code step or the gain of a nominal step in the calibration code. The initialization routine involves changing a comparator's calibration code by 1 and measuring how much the mean of the comparator's output changes. With this information from the initialization routine, it is possible to determine a threshold for the comparator's mean. If the comparator's mean is outside that threshold, there is enough offset in comparator that would benefit from an offset correction. Whenever a comparator's calibration code is changed, the gain of a calibration code step is measured again and the calibration threshold is updated again. The calibration method can track changes in the gain of the calibration codes due to aging, supply, and temperature variation.

In 1202, the method adjusts the calibration code for a selected comparator by 1. In 1204, the method measures gain of the calibration code step 1204. In 1206, the method generates calibration threshold based on the measured gain. In 1208, the mean of the output from the selected comparator is measured. In 1210, the method checks whether the measured mean is outside the calibration threshold. If the mean is not outside the calibration threshold, then the method advances to a next comparator 1212 and proceeds to measure the mean of the output from the next comparator in 1208. If the mean is outside of the calibration threshold, the method may proceed with the correction of the comparator. The method, in 1214, may adjust the calibration code for the selected comparator by 1. In 1216 and 1218, the mean of the comparator is measured again and the calibration threshold is updated again based on the newly measured mean of the comparator. In 1220, the method may advance to a next comparator to repeat the checking of the mean and updating of the calibration threshold for the next comparator.

In some cases, the internal analog-to-digital converter whose offsets are to be calibrated is in a MASH ADC, such as the one seen in FIG. 3. To calibrate the relative offsets of the comparators in "FLASH1" 308 and "FLASH2" 316, the MASH ADC analog circuitry may be configured such that only the comparators are being exercised. The setup involves disconnecting the input and turning off any amplifier or DAC that exists in the closed loop of a stage. For instance, the calibration method includes turning off digital-to-analog converters, amplifiers, some resistors. Integrators may be set to reset mode. In some embodiments, the dither in the second order back end may be enabled to increase activity in the back end. Resistances may be adjusted so that there is a direct path for dither to the quantizer "FLASH2" 316 input. Besides making one or more of these adjustments, adaptive shuffling of the signal paths of the comparators in the in "FLASH1" 308 and "FLASH2" 316 are turned on. For instance, a constant +1 shuffling scheme may be used.

The fundamental method to calibrate both stages is the same as previously described, where the calibration scheme measures the mean of each comparator, and performs correction to drive the means to be substantially equal to each other or to some ideal value. The calibration system can include circuitry for forcing comparators which are not under test to output a static value while a comparator under test is being measured. For instance, all comparators of an internal analog-to-digital converter that is being calibrated can be forced to output a static value. Then, one comparator is activated at a time and the average output for each comparator is measured, one activated comparator at a time. The relative differences or "delta" in the average output between each comparator is driven to be closer to each other (or closer to a target output), thus correcting for relative offset error. The method can be performed in several iterations.

The calibration current for correcting the comparator output can be programmable. In some cases, if any of the comparators' offset correction code has maxed out, the method can increase the calibration current (reduces resolution and increases range) and repeat the whole calibration process again.

Figure 13:
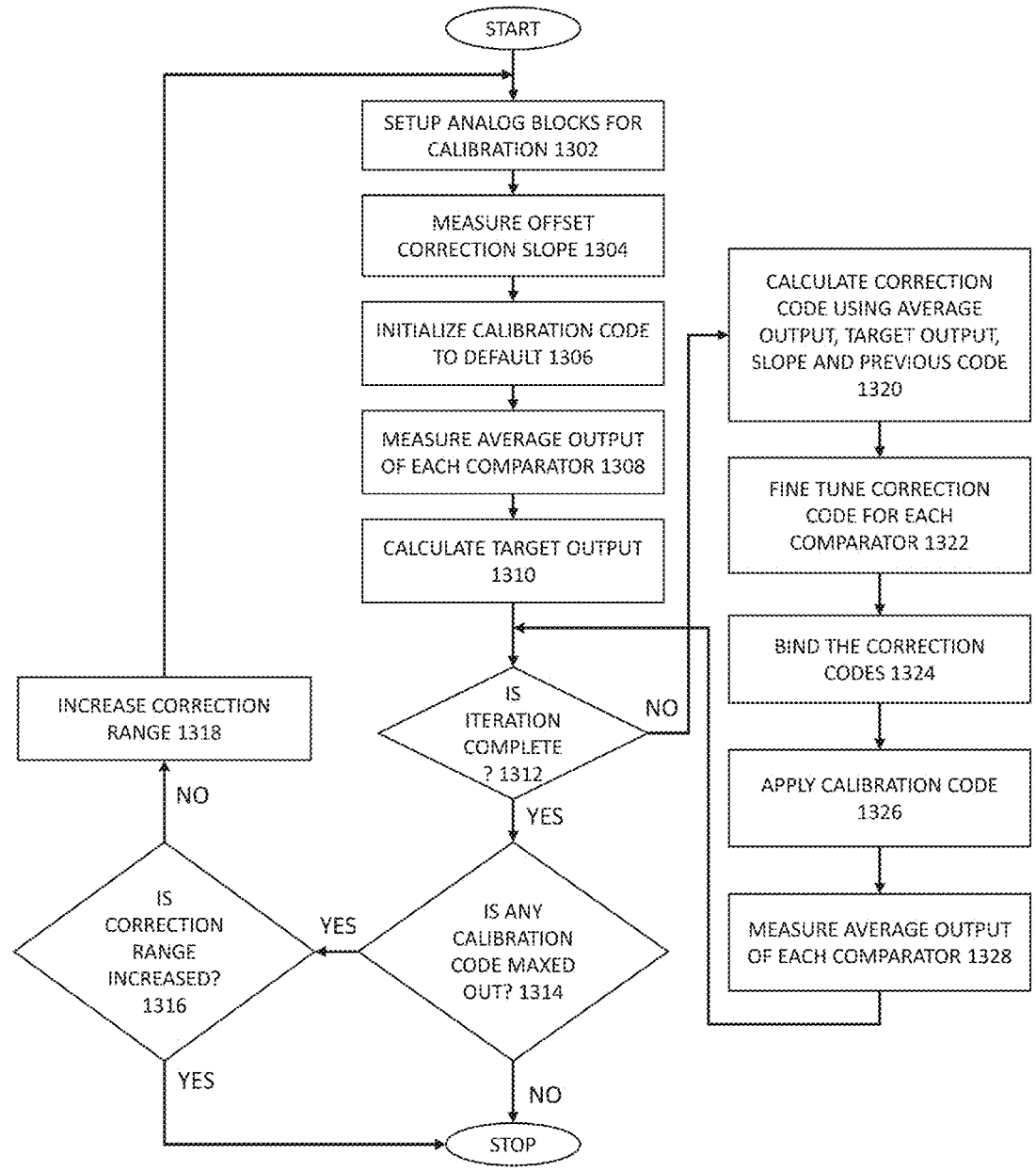
FIG. 13 illustrates another exemplary method for calibrating an internal analog-to-digital converter, according to some embodiments of the disclosure.

FIG. 13 illustrates another exemplary method for calibrating an internal analog-to-digital converter, according to some embodiments of the disclosure. In 1302, the analog blocks or circuitry is configured or setup for calibration (e.g., turning off digital-to-analog converters, putting integrators in a reset mode, turning amplifiers off, etc.). In 1304, the slope of the correction range for offset calibration is measured. In 1306, calibration codes for the comparators are initialized to default, e.g., zero. In 1308, average output of each comparator is measured. In 1310, target output of the each comparator is calculated to reduce relative offset between comparators. Iterative correction includes a loop which checks whether a desired number of iterations are complete in 1312. If not, the method executes an iteration of the loop. The loop includes, in 1320, calculating a new correction code for each comparator using the average output, target output, slope of the correction range, and the previous correction code. The new correction code aims to move the comparator output closer to the target output. In 1322, the new correction code is fine tuned. For instance, one implementation, the new correction code is swept from three codes before the new correction code to three codes after the new correction codes, and select a correction code which gets the comparator output closest to the target output is selected. In 1324, the method binds the new correction code. In some cases, if any code is out of range, the nearest possible code is used as the new correction code. In 1326, the new calibration code is applied. In 1328, the resulting average output for each comparator is measured again. The method loops back to determine whether the iterations are complete.

In 1314, the method checks if any correction code has maxed out (hitting the maximum values). If yes, in 1316, the method checks if the correction range (per code) is increased. If the correction range is not increased, the method increases the correction range 1318.

Figure 14:
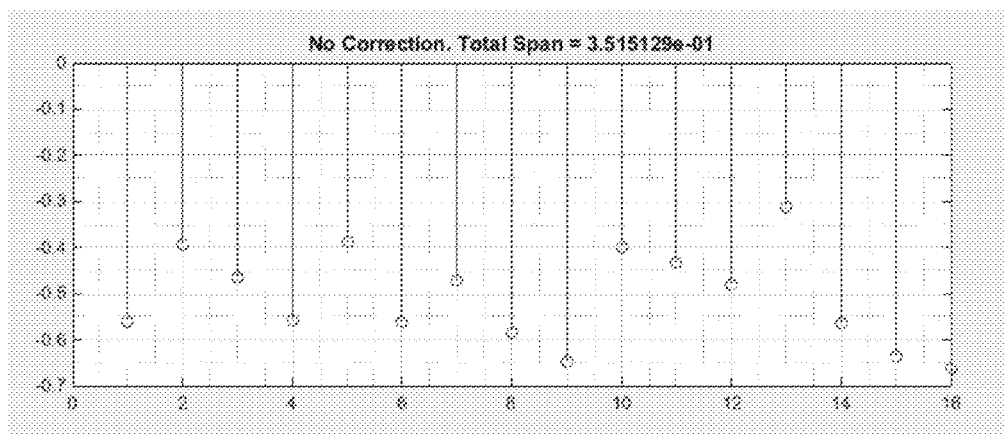
FIG. 14 shows average output of comparators, according to some embodiments of the disclosure.

In 1308 and 1328, average output of each comparator is measured. For instance, suppose there are 16 comparators in the internal analog-to-digital converter, and an output of each comparator can have 3 states: forced output of +1, forced output of −1, or free running. To measure the average output of a comparator, the comparator under test is allowed to be free running while the other comparator outputs are set to a static value. In one example, 7 comparators are held at +1 and the remaining 8 are held at −1 such that the average output is around −0.5 LSBs (minus half the value of a least significant bit "LSB"). The average output code of the (overall) internal analog-to-digital converter is then considered to be the average output of the comparator under test. To measure the offset of the first 8 comparators, the first 8 comparators are forced to output +1 and the remaining 8 comparators are forced to output to −1 for an average output of 0 LSBs. Within the set of the first 8 comparators, the output of one comparator at a time is flipped to 0, measure average output, and then the output of the comparator is flip back to +1. For the average output of the remaining 8 comparators, the first 8 comparators are forced to output −1 and the remaining 8 comparators are forced to output +1. Within the set of the remaining 8 comparators, the output of one comparator at a time is flipped to 0, measure average output, and then the output of the comparator is flip back to +1. Doing this output measurement in 2 states ensures that the average output for each comparator is around −0.5LSBs which can make the correction coefficient calculation easier. FIG. 14 shows average output of comparators, according to some embodiments of the disclosure. On the horizontal axis is comparator number and on the vertical axis is average output in LSBs.

Figure 15:
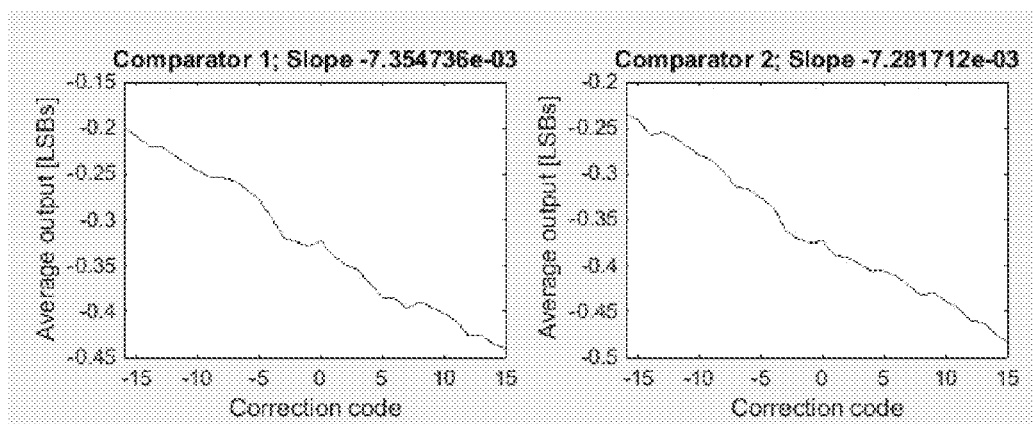
FIG. 15 shows different slopes of correction range for two comparators, according to some embodiments of the disclosure.

Once the average output for each comparator is measured, calibration codes are determined to ensure that the relative differences between the average outputs are minimized. In other words, calibration codes are determined by setting all of the comparator average outputs to the same value referred herein as the "target output". Target output, in some cases, can be the mean of the maximum output and minimum output among the comparator outputs. In one example, the default correction code is 0 and calibration range or correction code range for each comparator is from −16 to +15, taking the mean of the maximum and minimum output ensures that the full correction range for each comparator in one direction or the other is utilized. This reduces the possibility of maxing out calibration coefficients. The correction code controls a reference correction current which increases or decreases the average comparator output. The correction applied is linear and can be represented by a two-point equation of a straight line. To find the slope of this correction, for each comparator, the calibration code is set to one end, e.g., −14, and measure the average output. Then, the calibration code is set the other end, e.g., +14, and measure the average output. Using the correction code and respective average output, it is possible to derive the slope of the correction range. FIG. 15 shows different slopes of correction range for two comparators, according to some embodiments of the disclosure. The plots show a sweep of average output over correction code demonstrating the linear nature of the correction code for 2 comparators.

Since the correction range has a linear effect, a two-point equation is to find the calibration code closest to the target output. Based on the average output that is generated by the current correction code, it is possible to estimate code by using the following equation:

$$\text{CorrectionSlope} = \text{TargetOutput} - \text{AverageOutput}/\text{TargetCode} - \text{CurrentCode} \quad (3)$$

'TargetCode' is the new estimate for the correction code. The equation can be reorganized as follows:

$$\text{TargetCode} = \text{TargetOutput} - \text{AverageOutput}/\text{CorrectionSlope} + \text{CurrentCode} \quad (4)$$

Once an estimate correction code is determined, the method can optionally fine tune the estimate correction code by sweeping a few codes before and few codes after the estimate to find the best correction code. In one example, correction codes which are 3 codes before the estimate to correction codes which are 3 codes after the estimate are tested, and the best correction code out of the 7 that brings the average output closest to the target output is selected.

EXAMPLES

Example 1 is a method for calibrating an internal analog-to-digital converter, the method comprising: shuffling signal paths of an internal analog-to-digital converter; generating comparator outputs by the analog-to-digital converter; measuring mean of each comparator output in the internal analog-to-digital converter; and estimating comparator offsets based on the measured means. For examples mentioned herein, measured means can be measured sums.

In Example 2, Example 1 can optionally include measuring the mean of each comparator output comprising accumulating samples of a given comparator output to obtain the mean.

In Example 3, Example 1 or 2 can optionally include estimating comparator offsets comprising determining relative differences between the measured means.

In Example 4, any one of the above Examples can optionally include determining an impulse response matrix corresponding to the shuffling of signal paths; wherein estimating comparator offsets includes applying an inverse of the impulse response matrix to the measured means prior to determining the comparator offsets.

In Example 5, any one of the above Examples can optionally include adjusting the comparators based on the estimated comparator offsets.

In Example 6, any one of the above Examples can optionally include shuffling signal paths of the internal analog-to-digital converter comprising shuffling reference voltages provided to comparators of the internal analog-to-digital converter.

In Example 7, any one of the above Examples can optionally include shuffling signal paths of the internal analog-to-digital converter ensures that comparators of the internal analog-to-digital converter experiences substantially a same number of transitions over time.

In Example 8, any one of the above Examples can optionally include disconnecting an input of an analog-to-digital converter having the internal analog-to-digital converter prior to the generating of the comparator outputs.

In Example 9, any one of the above Examples can optionally include measuring the mean of each comparator output comprising measuring a sum of samples of a given comparator output.

In Example 10, any one of the above Examples can optionally include the shuffling and the generating being performed while an input signal is provided to an input of an analog-to-digital converter having the internal analog-to-digital converter Example 11 is a calibration system for an internal analog-to-digital converter, the calibration system comprising: a (mean or sum) measurement block for computing a mean value for each comparator output (or value representative of the mean value of each comparator output) in the internal analog-to-digital converter, wherein the internal analog-to-digital converter has signal paths which are shuffled; and a calibration block for determining offset calibration codes based on the mean values computed by the mean measurement block, wherein the offset calibration codes are usable to adjust comparator offsets in the internal analog-to-digital converter.

In Example 12, any one of above Examples can optionally include the calibration block determining offset calibration codes based on relative differences between the mean values.

In Example 13, any one of above Examples can optionally include circuitry for forcing comparators which are not under test to output a static value while a comparator under test is being measured.

In Example 14, any one of above Examples can optionally include the calibration block further determining an impulse response matrix corresponding to the shuffling of signal paths and applying an inverse of the impulse response matrix to the mean values prior to determining the offset calibration codes.

In Example 15, any one of above Examples can optionally include the offset calibration codes controlling reference correction currents, wherein each reference correction current changes an average comparator output.

In Example 16, any one of above Examples can optionally include the mean measurement block comprising one or more of the following: a digital counter, a digital adder, and an accumulator.

In Example 17, any one of above Examples can optionally include the calibration block being implemented in a programmable microprocessor embedded on-chip with an analog-to-digital converter having the internal analog-to-digital converter configured to execute instructions that determines the offset calibration codes.

In Example 18, any one of above Examples can optionally include the mean measurement block and the calibration block being implemented as digital logic on-chip with an analog-to-digital converter having the internal analog-to-digital converter.

Example 19 is a delta-sigma modulator having offset calibration, the apparatus comprising: an internal analog-to-digital converter for generating comparator outputs based on the reference voltages and an analog signal from a loop filter; means for shuffling reference voltages of the internal analog-to-digital converter; means for computing an average for each comparator output of the internal analog-to-digital converter; means for estimating offsets of comparators in the internal analog-to-digital converter based on relative differences between the averages; and means for correcting the offsets of comparators based on the estimated offsets.

In Example 20, any one of above Examples can optionally include: means for determining an impulse response matrix of the means for shuffling reference voltages; wherein the means for estimating offsets of the comparators takes into account the impulse response matrix.

In Example 21, any one of the above Examples can optionally include means for implementing or carrying out the methods of Examples 1-10 and methods illustrated by the FIGURES.

Other Implementation Notes, Variations, and Applications

In various examples, the calibration scheme uses of an average output of a comparator or a mean of a comparator output. It is equivalent to use a sum of the outputs as the mean or average. In other words, when measuring a mean or an average, it is envisioned by the disclosure that the circuitry is measuring a value representative of the mean or average. Such value representative of the mean or average can be a sum. The "mean" and the "sum" can be equivalent because mathematically Mean=Sum/N and if N is the same, then sum measurement is simply a linearly scaled version of the mean. For instance, the mean measurement block can be replaced with a sum measurement block as long as the number of samples (N) taken for the sum is consistent between different runs of the measurement.

In some embodiments, the system or integrated circuit includes a microprocessor on-chip with the ADC for performing any one or more computations associated with the calibration of offsets in the internal analog-to-digital converter. In some cases, averaging of the comparator outputs may be performed by dedicated digital circuitry. In some cases, operations relating to offset calibration and other operations described herein can be carried out by the on-chip microprocessor.

While the embodiments described herein are described in relation to offset calibration of an internal analog-to-digital converter in a delta sigma modulator, e.g., a continuous time delta sigma ADC, a continuous-time MASH ADC, the techniques can be applied to other ADCs architectures, such as a CT pipelined ADC and discrete-time pipelined ADC. The techniques are applicable to various MASH ADCs, including continuous-time MASH ADCs (which uses continuous-time circuits), discrete-time MASH ADCs (which uses switched-capacitor circuits), or a hybrid continuous-time and discrete-time MASH ADC. While some examples herein relate to a 1-2 MASH ADC, the offset calibration schemes are applicable to MASH ADCs having different order modulators (e.g., a 2-2 MASH ADCs), or MASH ADCs having more than two stages. The disclosed embodiments for offset calibration are particularly suitable for high speed, continuous-time, high precision applications where delta-sigma modulators are used. Applications which can greatly benefit from the architecture include: instrumentation, testing, spectral analyzers, military purposes, radar, wired or wireless communications, mobile telephones (especially because standards continue to push for higher speed communications), and base stations.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to offset calibration for an internal analog-to-digital converter such as the processes shown in FIGS. 10-13, illustrate only some of the possible functions that may be executed by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A method for calibrating an internal analog-to-digital converter, the method comprising:
   shuffling signal paths of an internal analog-to-digital converter;
   generating comparator outputs by the internal analog-to-digital converter;
   measuring mean values of respective comparator outputs in the internal analog-to-digital converter; and
   estimating comparator offsets based on the measured mean values.

2. The method of claim 1, wherein measuring the mean values of respective comparator outputs comprises accumulating samples of a given comparator output to obtain a given mean value of the given comparator output.

3. The method of claim 1, wherein estimating comparator offsets comprises determining relative differences between the measured mean values.

4. The method of claim 1, further comprising:
   determining an impulse response matrix corresponding to the shuffling of the signal paths;
   wherein estimating comparator offsets includes applying an inverse of the impulse response matrix to the measured mean values prior to determining the comparator offsets.

5. The method of claim 1, further comprising:
   adjusting comparators of the internal analog-to-digital converter based on the estimated comparator offsets.

6. The method of claim 1, wherein shuffling signal paths of the internal analog-to-digital converter comprises shuffling reference voltages provided to comparators of the internal analog-to-digital converter.

7. The method of claim 1, wherein shuffling signal paths of the internal analog-to-digital converter ensures that comparators of the internal analog-to-digital converter experience substantially a same number of transitions over time.

8. The method of claim 1, further comprising:
   disconnecting an input of an analog-to-digital converter having the internal analog-to-digital converter prior to the generating the comparator outputs.

9. The method of claim 1, wherein measuring the mean values of respective comparator outputs comprises measuring a sum of samples of a given comparator output.

10. The method of claim 1, wherein:
    the shuffling and the generating are performed while an input signal is provided to an input of an analog-to-digital converter having the internal analog-to-digital converter.

11. A calibration system for an internal analog-to-digital converter, the calibration system comprising:
    one or more averaging blocks for computing mean values for respective comparator outputs in the internal analog-to-digital converter, wherein the internal analog-to-digital converter has signal paths which are shuffled; and
    a calibration block for determining offset calibration codes based on the mean values computed by the one or more averaging blocks, wherein the offset calibration codes are usable to adjust comparator offsets in the internal analog-to-digital converter.

12. The calibration system of claim 11, wherein the calibration block determines offset calibration codes based on relative differences between the mean values.

13. The calibration system of claim 11, further comprising:
    circuitry for forcing comparators which are not under test to output a static value while a comparator under test is being measured.

14. The calibration system of claim 11, wherein the calibration block further determines an impulse response matrix corresponding to a shuffler which shuffles the signal paths and applies an inverse of the impulse response matrix to the mean values prior to determining the offset calibration codes.

15. The calibration system of claim 11, wherein the offset calibration codes control reference correction currents, wherein each reference correction current changes an average comparator output.

16. The calibration system of claim 11, wherein the one or more averaging blocks comprises one or more of the following: a digital counter, a digital adder, and an accumulator.

17. The calibration system of claim 11, wherein the calibration block is implemented in a programmable microprocessor embedded on-chip with an analog-to-digital converter having the internal analog-to-digital converter configured to execute instructions that determines the offset calibration codes.

18. The calibration system of claim 11, wherein the one or more averaging blocks and the calibration block are implemented as digital logic on-chip with an analog-to-digital converter having the internal analog-to-digital converter.

19. A delta-sigma modulator having offset calibration, the delta-sigma modulator comprising:

an internal analog-to-digital converter for generating comparator outputs based on reference voltages provided to respective comparators and an analog signal from a loop filter;

means for shuffling the reference voltages of the internal analog-to-digital converter;

means for computing average values of respective comparator outputs of the internal analog-to-digital converter;

means for estimating offsets of the respective comparators in the internal analog-to-digital converter based on relative differences between the average values; and means for correcting offsets of the respective comparators based on the estimated offsets.

20. The delta-sigma modulator of claim 19, further comprising:

means for determining an impulse response matrix of the means for shuffling the reference voltages;

wherein the means for estimating offsets of the comparators takes into account the impulse response matrix.

* * * * *